(12) United States Patent
Fujino et al.

(10) Patent No.: US 6,989,597 B2
(45) Date of Patent: Jan. 24, 2006

(54) SEMICONDUCTOR INTEGRATED CIRCUIT AND METHOD OF MANUFACTURING THE SAME

(75) Inventors: Takeya Fujino, Takatsuki (JP); Fumihiro Kimura, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 90 days.

(21) Appl. No.: 10/685,387

(22) Filed: Oct. 16, 2003

(65) Prior Publication Data

US 2004/0089911 A1    May 13, 2004

(30) Foreign Application Priority Data

Oct. 18, 2002   (JP)   .............................. 2002-304218

(51) Int. Cl.
*H01L 23/48* (2006.01)

(52) U.S. Cl. ...................................... 257/737; 438/613
(58) Field of Classification Search ................ 257/737, 257/738, 778; 438/108, 613
See application file for complete search history.

(56) References Cited

U.S. PATENT DOCUMENTS

| 5,477,933 A | * | 12/1995 | Nguyen ....................... 174/262 |
| 6,100,591 A | | 8/2000 | Ishii |
| 6,313,537 B1 | | 11/2001 | Lee et al. |

FOREIGN PATENT DOCUMENTS

JP    2001 284536    10/2001

* cited by examiner

*Primary Examiner*—Roy Potter
(74) *Attorney, Agent, or Firm*—Stevens, Davis, Miller & Mosher, LLP

(57) ABSTRACT

Prevention of coming off of the layer where the contacts are formed and the isolating film and breakage of the LSI is realized. To do this, a contact array is provided in which a plurality of contacts is formed so as to be aligned in the vertical and the horizontal directions. In the contact array, the contact formation spacing in both of the vertical and the horizontal directions is larger than the contact formation spacing determined by the manufacturing process. Consequently, the number of contacts formed in the contact array can be reduced to not more than the number of contacts that can be formed in the unit area determined by the process, so that prevention of coming off of the layer where the contacts are formed and the isolating film and breakage of the LSI can be realized.

30 Claims, 14 Drawing Sheets

SEMICONDUCTOR INTEGRATED CIRCUIT AND METHOD OF MANUFACTURING THE SAME

BACKGROUND OF THE INVENTION

1. Field of the Invention

The present invention relates to a semiconductor integrated circuit and a method of manufacturing same. More particularly, the present invention relates to a structure of a semiconductor integrated circuit and a method of manufacturing same in which coming off of the layer where the contacts are formed and the insulating film and breakage of the LSI can be prevented by reducing the number of contact holes.

2. Prior Art

Presently, in designing a semiconductor integrated circuit, when a wiring layer is changed in routing, contacts are regularly formed in numbers that can be formed, between wiring regions where different wirings overlap with each other, with the height, the width and the spacing determined by the design rule of each process, so as to be aligned in the direction of the height and the width of the contacts.

The above-mentioned height determined by the design rule of each process is the vertical size of rectangular contacts. Likewise, the width is the horizontal size of rectangular contacts. In the following description, "determined by the design rule of each process" is abbreviated as "determined by the process."

When two or more wiring layers are changed, contacts of the intermediate layers are regularly formed in numbers that can be formed, with the height, the width and the spacing determined by the process in the same region as the region where the wirings of the upper and the lower layers overlap with each other.

A contact array comprises a plurality of contacts having a predetermined size and regularly arranged two-dimensionally, that is, arranged in a matrix at predetermined spacings. For example, a method has been proposed of preventing design rule errors caused by contact arrays of the above-described structure adjoining each other when wirings of different layers are connected together with an automatic layout apparatus (Japanese Laid-Open Patent Application No. 2000-284536 [page 1, FIG. 2]).

As described above, generally, in a contact array, when wirings are changed, contacts are regularly formed in numbers that can be formed, with the height, the width and the spacing determined by the process in the same region as a region where different wirings overlap with each other.

Moreover, as the process has been becoming finer in recent years, the area of each contact has been decreasing and the spacing between contacts has also been decreasing. For this reason, as shown in FIG. 13, in a case where the wiring layer is changed from a vertical wiring 1301 to a horizontal wiring 1302, when as many contacts as possible are regularly formed with the height, the width and the spacing determined by the process in a region where different wirings overlap with each other, the number of contacts making up a contact array 1303 increases. Consequently, there is a possibility that the number of contacts exceeds the number of contacts that can be formed in the unit area determined by the design rule of each process, for example, in a rectangular region of a predetermined size.

As shown in FIG. 13, when a large number of contacts are formed close to each other, there are cases where the layer where the contacts are formed and the insulating film come off and the LSI is broken. To prevent such coming off of the layer where the contacts are formed and the insulating film, it is effective to reduce the number of contacts formed in the region where the wiring layers overlap with each other.

SUMMARY OF THE INVENTION

The present invention solves the above-mentioned problems of the prior art, and an object thereof is to provide a semiconductor integrated circuit and a method of manufacturing same in which prevention of coming off of the layer where the contacts are formed and the insulating film and breakage of the LSI can be realized by reducing the number of contacts formed in the contact array to not more than the number of contacts that can be formed in the unit area determined by the process.

To solve the above-mentioned problem, a semiconductor integrated circuit according to a first aspect of the invention has a contact array in which a plurality of contacts is formed so as to be aligned in the vertical and the horizontal directions. The contact formation spacing in one of the vertical and the horizontal directions in the contact array is larger than the contact formation spacing determined by the manufacturing process.

According to this structure, by increasing the contact formation spacing in one of the vertical and the horizontal directions in the contact array so as to be larger than the contact formation spacing determined by the manufacturing process, the number of contacts formed in the contact array can be reduced to not more than the number of contacts that can be formed in the unit area determined by the process. Consequently, coming off of the layer where the contacts are formed and the insulating film and breakage of the LSI can be prevented.

A semiconductor integrated circuit according to a second aspect of the invention has a contact array in which a plurality of contacts is formed so as to be aligned in the vertical and the horizontal directions. The contact formation spacing in both of the vertical and the horizontal directions in the contact array is larger than the contact formation spacing determined by the manufacturing process.

According to this structure, by increasing the contact formation spacing in both of the vertical and the horizontal directions in the contact array so as to be larger than the contact formation spacing determined by the manufacturing process, the number of contacts formed in the contact array can be reduced to not more than the number of contacts that can be formed in the unit area determined by the process. Consequently, prevention of coming off of the layer where the contacts are formed and the insulating film and breakage of the LSI can be realized. Further, by increasing the contact formation spacing in both of the vertical and the horizontal directions in the contact array so as to be larger than the contact formation spacing determined by the manufacturing process, coming off can be prevented in both of the vertical and the horizontal directions, so that prevention of coming off of the layer where the contacts are formed and the insulating film and breakage of the LSI can be more reliably realized.

A semiconductor integrated circuit according to a third aspect of the invention has a contact array in which a plurality of contacts is formed so as to be aligned in the vertical and the horizontal directions, the contact array is formed by placing a first contact array unit and a second contact array unit one on another, and the first and the second contact array units have a structure in which a plurality of contacts is formed so as to be aligned in the vertical and the horizontal directions. The contact formation spacing in at least one of the vertical and the horizontal directions in each of the first and the second contact array units is larger than the contact formation spacing determined by the manufacturing process, and the first and the second contact array units are placed one on another so as to be shifted from each other so that the contact formation positions of the first contact array unit are situated midway between the contact formation positions of the second contact array unit both in the vertical and the horizontal directions.

According to this structure, the contact formation spacing in at least one of the vertical and the horizontal directions in each of the first and the second contact array units is larger than the contact formation spacing determined by the manufacturing process, and the contact formation positions of the first contact array unit are situated midway between the contact formation positions of the second contact array unit both in the vertical and the horizontal directions. Consequently, the number of contacts formed in the contact array can be reduced to not more than the number of contacts that can be formed in the unit area determined by the process. Consequently, prevention of coming off of the layer where the contacts are formed and the insulating film and breakage of the LSI can be realized. Further, when contacts are formed with the same size and the same numbers and in the same area, contacts can be formed at larger spacings in both of the vertical and the horizontal directions, so that the effect of preventing coming off of the layer where the contacts are formed and the insulating film can be enhanced.

A semiconductor integrated circuit according to a fourth aspect of the invention has a contact array in which a plurality of contacts is formed so as to be aligned in the vertical and the horizontal directions, the entire area of the chip is swept while overlap of regions of the unit area determined by the manufacturing process is allowed, the number or the area of contacts formed so as to be aligned in the vertical and the horizontal directions which contacts are present in the regions of the unit area is obtained, and the contact formation spacing is increased so that the number or the area of contacts included in the regions of the unit area is not more than a predetermined value.

According to this structure, the number of contacts that can be formed is not exceeded when viewed in units of regions of the unit area, so that coming off of the layer where the contacts are formed and the insulating layer and breakage of the LSI can be prevented.

In the semiconductor integrated circuits according to the first to the fourth aspects of the invention, the rate of reduction of the number of contacts when the contact formation spacing is increased may be varied according to the size of the contact array.

According to this structure, it can be prevented that electromigration and an IR drop phenomenon (a voltage drop corresponding to the current I×the wiring resistance R) occur due to overreduction of the number of contacts in small contact arrays.

A semiconductor integrated circuit according to a fifth aspect of the invention has a contact array in which a plurality of contacts is formed so as to be aligned in the vertical and the horizontal directions, and the contact array is divided into at least two contact array regions. In at least one of the contact array regions, contacts are formed at spacings not less than the contact formation spacings determined by the manufacturing process and in the remaining contact array region, contacts are formed at contact formation spacings larger than the contact formation spacing in the at least one of the contact array regions.

According to this structure, in at least one of the contact array regions, contacts are formed at spacings not less than the contact formation spacings determined by the manufacturing process and in the remaining contact array region, contacts are formed at contact formation spacings larger than the contact formation spacing in the at least one of the contact array regions, so that prevention of coming off of the layer where the contacts are formed and the insulating film and breakage of the LSI can be more reliably realized.

A semiconductor integrated circuit according to a sixth aspect of the invention has a contact array in which a plurality of contacts is formed so as to be aligned in the vertical and the horizontal directions, and the contact array is divided into at least three contact array regions. The number or the area of contacts present in the region of the unit area is obtained, and contacts are formed at spacings not less than the contact formation spacings determined by the manufacturing process in each of at least two of the contact array regions arranged at predetermined region spacings so that the number or the area of contacts included in the region of the unit area is not more than a predetermined value.

According to this structure, since contacts are formed at spacings not less than the contact formation spacings determined by the manufacturing process at predetermined region spacings in at least two contact array regions, prevention of coming off of the layer where the contacts are formed and the insulating film and breakage of the LSI can be more reliably realized.

The semiconductor integrated circuits according to the first to the fourth aspects of the invention may be structured as follows: The semiconductor integrated circuits have a structure in which at least three layers of contact arrays are longitudinally laminated, and in the contact array of the intermediate layer, as a result of increasing the contact formation spacing, the contacts remaining in the contact array of the intermediate layer are re-arranged at spacings not less than the contact spacings determined by the process, whereby the region of the contact array of the intermediate layer is smaller than the regions of the contact arrays of the uppermost layer and the lowermost layer. The structure in which the rate of reduction of the number of contacts when the contact formation spacing is increased is varied according to the size of the contact array may be combined with this structure.

According to this structure, since the region of the contact array of the intermediate layer is smaller than the regions of the contact arrays of the uppermost and the lower most layers, the same wiring layer on the sides of the contact array of the intermediate layer can be used as wiring regions by other wirings. Consequently, it can be prevented that wirings are unconnected because of insufficient wiring resources.

A method of manufacturing a semiconductor integrated circuit according to a seventh aspect of the invention is a method of manufacturing a semiconductor integrated circuit having a contact array in which a plurality of contacts is formed so as to be aligned in the vertical and the horizontal directions, and the contact formation spacing in one of the vertical and the horizontal directions in the contact array is larger than the contact formation spacing determined by the manufacturing process.

According to this method, by increasing the contact formation spacing in one of the vertical and the horizontal directions in the contact array so as to be larger than the contact formation spacing determined by the manufacturing process, the number of contacts formed in the contact array can be reduced to not more than the number of contacts that can be formed in the unit area determined by the process.

Consequently, prevention of coming off of the layer where the contacts are formed and the insulating film and breakage of the LSI can be realized.

A method of manufacturing a semiconductor integrated circuit according to an eighth aspect of the invention is a method of manufacturing a semiconductor integrated circuit having a contact array in which a plurality of contacts is formed so as to be aligned in the vertical and the horizontal directions, and the contact formation spacing in both of the vertical and the horizontal directions in the contact array is larger than the contact formation spacing determined by the manufacturing process.

According to this method, by increasing the contact formation spacing in both of the vertical and the horizontal directions in the contact array so as to be larger than the contact formation spacing determined by the manufacturing process, the number of contacts formed in the contact array can be reduced to not more than the number of contacts that can be formed in the unit area determined by the process. Consequently, prevention of coming off of the layer where the contacts are formed and the insulating film and breakage of the LSI can be realized. Further, by increasing the contact formation spacing in both of the vertical and the horizontal directions in the contact array so as to be larger than the contact formation spacing determined by the manufacturing process, coming off can be prevented in both of the vertical and the horizontal directions, so that prevention of coming off of the layer where the contacts are formed and the insulating film and breakage of the LSI can be more reliably realized.

A method of manufacturing a semiconductor integrated circuit according to a ninth aspect of the invention is a method of manufacturing a semiconductor integrated circuit having a contact array in which a plurality of contacts is formed so as to be aligned in the vertical and the horizontal directions, and the contact array is formed by placing one on another a first contact array unit and a second contact array unit in which a plurality of contacts is formed so as to be aligned in the vertical and the horizontal directions. At this time, the contact formation spacing in at least one of the vertical and the horizontal directions in each of the first and the second contact array units is larger than the contact formation spacing determined by the manufacturing process, and the first and the second contact array units are placed one on another so as to be shifted from each other so that the contact formation positions of the first contact array unit are situated midway between the contact formation positions of the second contact array unit both in the vertical and the horizontal directions.

According to this method, the contact formation spacing in at least one of the vertical and the horizontal directions in each of the first and the second contact array units is larger than the contact formation spacing determined by the manufacturing process, and the contact formation positions of the first contact array unit are situated midway between the contact formation positions of the second contact array unit both in the vertical and the horizontal directions. Consequently, the number of contacts formed in the contact array can be reduced to not more than the number of contacts that can be formed in the unit area determined by the process. Consequently, prevention of coming off of the layer where the contacts are formed and the insulating film and breakage of the LSI can be realized. Further, when contacts are formed with the same size and the same numbers and in the same area, contacts can be formed at larger spacings in both of the vertical and the horizontal directions, so that the effect of preventing coming off can be enhanced.

A method of manufacturing a semiconductor integrated circuit according to a tenth aspect of the invention is a method of manufacturing a semiconductor integrated circuit having a contact array in which a plurality of contacts is formed so as to be aligned in the vertical and the horizontal directions, and the entire area of the chip is swept while overlap of regions of the unit area determined by the manufacturing process is allowed, the number or the area of contacts formed so as to be aligned in the vertical and the horizontal directions which contacts are present in the regions of the unit area is obtained, and the contact formation spacing is increased so that the number or the area of contacts included in the regions of the unit area is not more than a predetermined value.

According to this method, the number of contacts that can be formed is not exceeded when viewed in units of regions of the unit area, so that coming off of the layer where the contacts are formed and the insulating layer and breakage of the LSI can be prevented.

In the methods of manufacturing a semiconductor integrated circuit according to the seventh to the tenth aspects of the invention, the rate of reduction of the number of contacts when the contact formation spacing is increased may be varied according to the size of the contact array.

According to this method, it can be prevented that electromigration and an IR drop phenomenon occur due to overreduction of the number of contacts in small contact arrays.

A method of manufacturing a semiconductor integrated circuit according to an eleventh aspect of the invention is a method of manufacturing a semiconductor integrated circuit having a contact array in which a plurality of contacts is formed so as to be aligned in the vertical and the horizontal directions, and the contact array is divided into at least two contact array regions. In at least one of the contact array regions, contacts are formed at spacings not less than the contact formation spacings determined by the manufacturing process and in the remaining contact array region, contacts are formed at contact formation spacings larger than the contact formation spacing in the at least one of the contact array regions.

According to this method, since in at least one of the contact array regions, contacts are formed at spacing not less than the contact formation spacings determined by the manufacturing process and in the remaining contact array region, contacts are formed at contact formation spacings larger than the contact formation spacing in the at least one of the contact array regions, prevention of coming off of the layer where the contacts are formed and the insulating film and breakage of the LSI can be more reliably realized.

A method of manufacturing a semiconductor integrated circuit according to a twelfth aspect of the invention is a method of manufacturing a semiconductor integrated circuit having a contact array in which a plurality of contacts is formed so as to be aligned in the vertical and the horizontal directions, and the contact array is divided into at least three contact array regions. The number or the area of contacts present in the region of the unit area is obtained, and contacts are formed at spacings not less than the contact formation spacings determined by the manufacturing process in each of at least two of the contact array regions arranged at predetermined region spacings so that the number or the area of contacts included in the region of the unit area is not more than a predetermined value.

According to this method, since contacts are formed at spacings not less than the contact formation spacings determined by the manufacturing process at predetermined region spacings in at least two contact array regions, prevention of coming off of the layer where the contacts are formed and the insulating film and breakage of the LSI can be more reliably realized.

In the methods of manufacturing a semiconductor integrated circuit according to the seventh to the tenth aspects of the invention, the semiconductor integrated circuits may be structured as follows: The semiconductor integrated circuits have a structure in which at least three layers of contact arrays are longitudinally laminated, and in the contact array of the intermediate layer, as a result of increasing the contact formation spacing, the contacts remaining in the contact array of the intermediate layer are re-arranged at spacings not less than the contact spacings determined by the process, whereby the region of the contact array of the intermediate layer is smaller than the regions of the contact arrays of the uppermost layer and the lowermost layer. The structure in which the rate of reduction of the number of contacts when the contact formation spacing is increased is varied according to the size of the contact array may be combined with this structure.

According to this method, since the region of the contact array of the intermediate layer is smaller than the regions of the contact arrays of the uppermost and the lower most layers, the same wiring layer on the sides of the contact array of the intermediate layer can be used as wiring regions by other wirings. Consequently, it can be prevented that wirings are unconnected because of insufficient wiring resources.

A semiconductor integrated circuit according to a thirteenth aspect of the invention has a contact array in which a plurality of contacts is formed so as to be aligned in the vertical and the horizontal directions, the contact array comprises contacts in the odd-numbered rows and contacts in the even-numbered rows disposed in positions shifted by substantially half a pitch from the contacts in the odd-numbered rows in the direction of the rows, and at least one of the contact spacing of the contacts in the odd-numbered rows and the contact spacing of the contacts in the even-numbered rows, and the spacing between the rows of the contacts in the odd-numbered rows and the spacing between the rows of the contacts in the even-numbered rows is larger than the contact formation spacing determined by the manufacturing process.

According to this structure, the number of contacts formed in the contact array can be reduced to not more than the number of contacts that can be formed in the unit area determined by the process. Consequently, prevention of coming off of the layer where the contacts are formed and the insulating film and breakage of the LSI can be realized. Further, when contacts are formed with the same area and the same size and in the same numbers, contacts can be formed at larger spacings in both of the vertical and the horizontal directions, so that the effect of preventing coming off can be enhanced.

DESCRIPTION OF THE PREFERRED EMBODIMENTS (First Embodiment)

A first embodiment of the present invention will be described with reference to the drawings.

In embodying the present invention, wirings are formed by use of the design rule determined by the process like a general layout design. According to the design rule determined by the process, contacts are regularly formed in numbers that can be formed, in a matrix pattern with the height, the width and the spacing determined by the process.

Figure 1A:
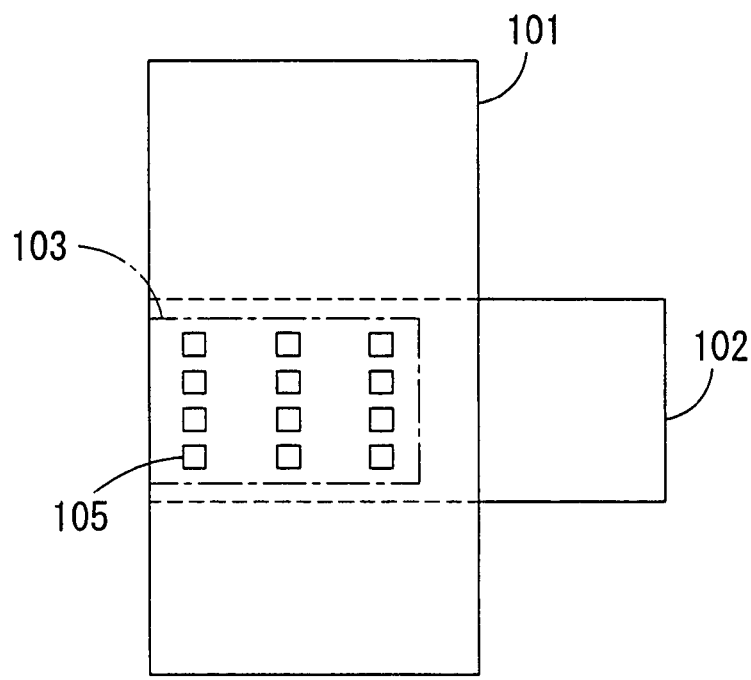
FIG. 1A is a schematic view showing a horizontally wide pitch contact array in a semiconductor integrated circuit according to a first embodiment of the present invention.
Figure 1B:
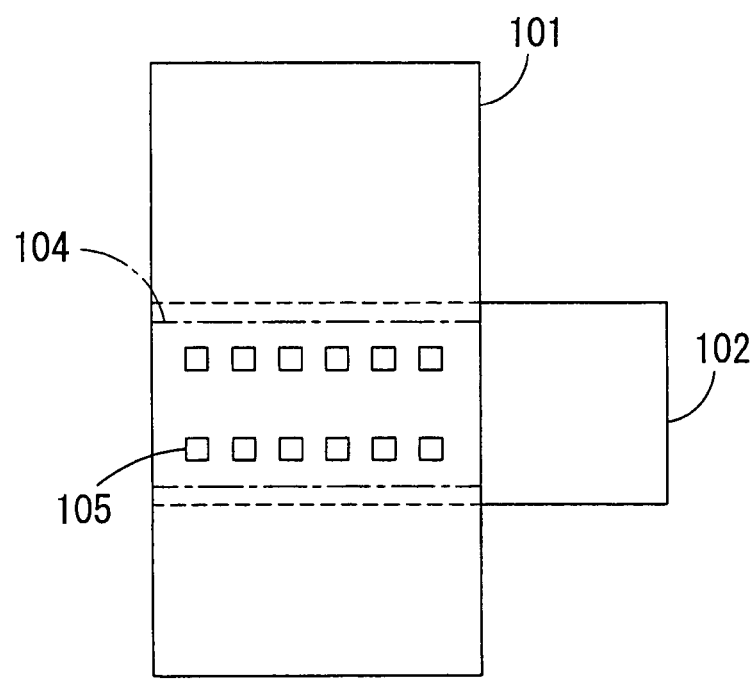
FIG. 1B is a schematic view showing a vertically wide pitch contact array in the semiconductor integrated circuit according to the first embodiment of the present invention.

In that case, when a contact array is inevitably formed including a larger number of contacts than the number of contacts that can be formed in the unit area determined by the process, to avoid this, wiring is performed by use of a unidirectionally wide pitch contact array shown in FIG. 1A or 1B.

FIGS. 1A and 1B show two kinds of unidirectionally wide pitch contact arrays. In FIG. 1A, reference numeral 101 represents a vertical wiring, reference numeral 102 represents a horizontal wiring of a different layer from the wiring 101, reference numeral 103 represents an X-direction (horizontally) wide pitch contact array, and reference numeral 105 represents contacts arranged in a matrix pattern. In FIG. 1B, reference numeral 104 represents a Y-direction (vertically) wide pitch contact array. The remaining reference numerals represent the same elements as those of FIG. 1A.

The X-direction wide pitch contact array 103 is different from the contact array of the prior art in which contacts are regularly formed in numbers that can be formed, with the height, the width and the spacing determined by the process. That is, the height, the width and the vertical spacing with which the contacts 105 are formed are the height, the width and the spacing determined by the design rule of each process. However, the horizontal spacing with which the contacts 105 are formed are larger than the spacing determined by the process.

The Y-direction wide pitch contact array 104 is different from the contact array of the prior art in which contacts are regularly formed in numbers that can be formed, with the height, the width and the spacing determined by the process. That is, the height, the width and the horizontal spacing with which the contacts 105 are formed are the height, the width and the spacing determined by the design rule of each process. However, the vertical spacing with which the contacts 105 are formed are larger than the spacing determined by the process.

In the first embodiment, a method is described of providing the contact arrays 103 and 104 in which the spacing with which the contacts are formed is larger than the spacing determined by the process only in one of the horizontal and the vertical directions at the time of wiring. The present invention is not limited thereto. A method may be used such that, on the wiring result where all the wirings have been formed by use of the contact arrays of the prior art, only the contact array in which the number of contacts that can be formed in the unit area determined by the process is exceeded is replaced with the X-direction wide pitch contact array 103 or the Y-direction wide pitch contact array 104.

In reducing the number of contacts to not more than the number of contacts that can be formed in the unit area determined by the process, when the number of contacts can be further reduced as a result of considering electromigration and IR drop, the number of contacts may be reduced, or may be reduced with some margin being left.

By the above-described method, coming off of the layer where the contacts are formed and the insulating film is prevented.

According to the semiconductor integrated circuit structured as described above and the method of manufacturing same, the number of contacts in the contact arrays 103 and 104 can be reduced to not more than the number of contacts that can be formed in the unit area determined by the process by forming the contacts 105 at spacings larger than the spacing determined by the process. Consequently, prevention of coming off of the layer where the contacts 105 are formed and the insulating film can be realized, so that prevention of breakage of the LSI can be realized.

(Second Embodiment)

A second embodiment of the present invention will be described with reference to FIG. 2.

Like the method described in the first embodiment, wirings are formed by use of the design rule determined by the process. According to the design rule determined by the process, contacts are regularly formed in numbers that can be formed, in a matrix pattern with the height, the width and the spacing determined by the process.

Figure 2:
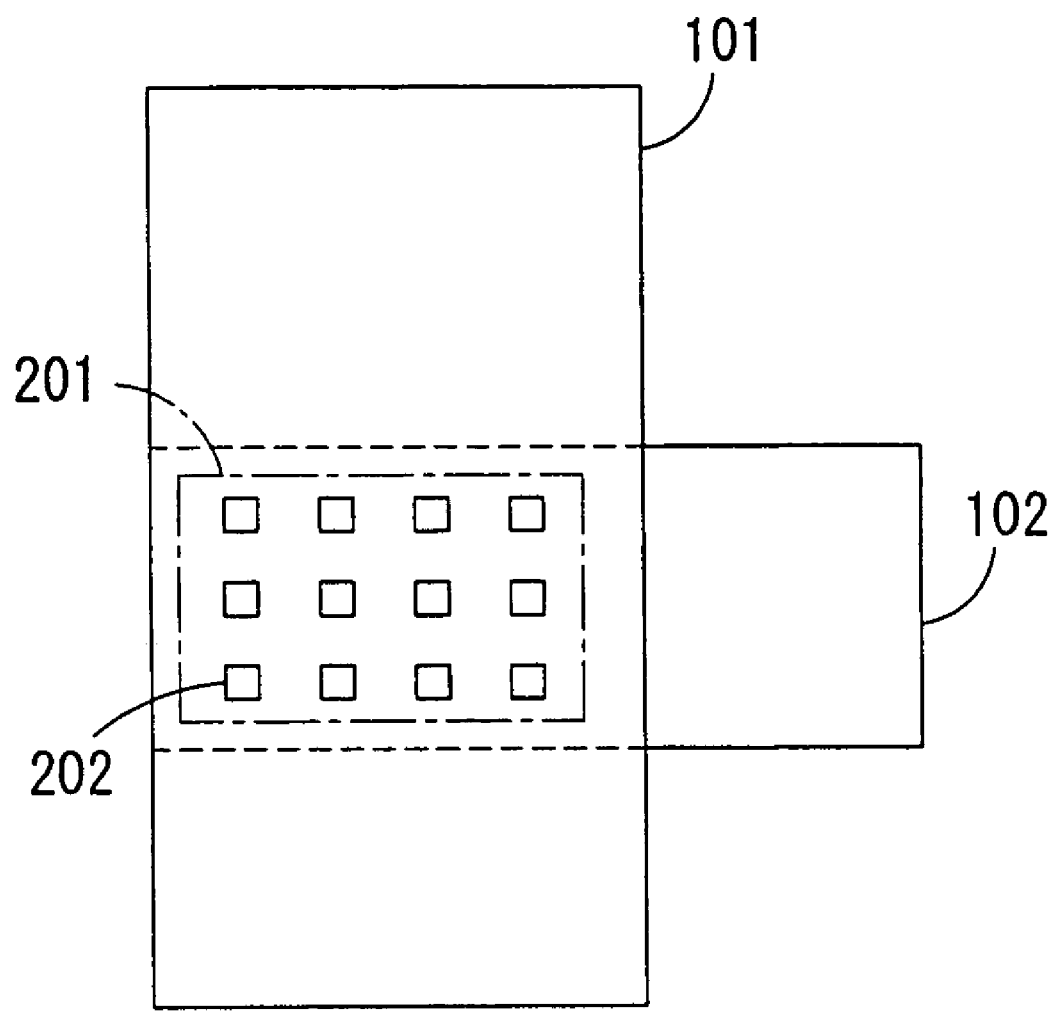
FIG. 2 is a schematic view showing a bidirectionally wide pitch contact array in a semiconductor integrated circuit according to a second embodiment.

In that case, when a contact array is inevitably formed including a larger number of contacts than the number of contacts that can be formed in the unit area determined by the process, to avoid this, wiring is performed by use of a bidirectionally wide pitch contact array shown in FIG. 2.

FIG. 2 shows the bidirectionally wide pitch contact array. In FIG. 2, reference numeral 101 represents a vertical wiring, reference numeral 102 represents a horizontal wiring of a different layer from the wiring 101, and reference numeral 201 represents the bidirectionally wide pitch contact array. Reference numeral 202 represents contacts arranged in a matrix pattern.

The bidirectionally wide pitch contact array 201 is different from the contact array of the prior art in which contacts are regularly formed in numbers that can be formed, with the height, the width and the spacing determined by the process. That is, the height and the width of the contacts 202 are the height and the width determined by the process. However, the horizontal and the vertical spacings with which the contacts 202 are formed are both larger than the spacing determined by the process.

The method described in the first embodiment is effective in preventing coming off of the layer where the contacts are formed and the insulating film. However, coming off of the layer where the contacts are formed and the insulating film can be prevented only in one of the horizontal and the vertical directions. According to the present embodiment, coming off of the layer where the contacts are formed and the insulating film can be prevented in both of the horizontal and the vertical directions.

While in the second embodiment, a method is described of forming the contact array 201 in which the spacing with which the contacts are formed is larger in both of the directions at the time of wiring, it may be performed to replace, on the wiring result where all the wirings have been formed by use of the contact arrays of the prior art, only the contact array in which the number of contacts that can be formed in the unit area determined by the process is exceeded, with the bidirectionally wide pitch contact array 201.

In reducing the number of contacts to not more than the number of contacts that can be formed in the unit area determined by the process, when the number of contacts can be further reduced as a result of considering electromigration and IR drop, the number of contacts may be reduced, or may be reduced with some margin being left.

By the above-described method, coming off of the layer where the contacts are formed and the insulating film is prevented.

According to the semiconductor integrated circuit structured as described above and the method of manufacturing same, the number of contacts in the contact array 201 can be reduced to not more than the number of contacts that can be formed in the unit area determined by the process by forming the contacts 202 at spacings larger than the spacing determined by the process. Consequently, coming off of the layer where the contacts 202 are formed and the insulating film and breakage of the LSI can be prevented.

Further, by forming the contacts 202 at spacings larger than the spacing determined by the process both in the horizontal and the vertical directions, coming off of the layer where the contacts 202 are formed and the insulating film in both of the horizontal and the vertical directions can be prevented.

(Third Embodiment)

A third embodiment of the present invention will be described with reference to the drawings.

Like the method described in the first embodiment, wirings are formed by use of the design rule determined by the process. According to the design rule determined by the process, contacts are regularly formed in numbers that can be formed, in a matrix pattern with the height, the width and the spacing determined by the process.

Figure 3A:
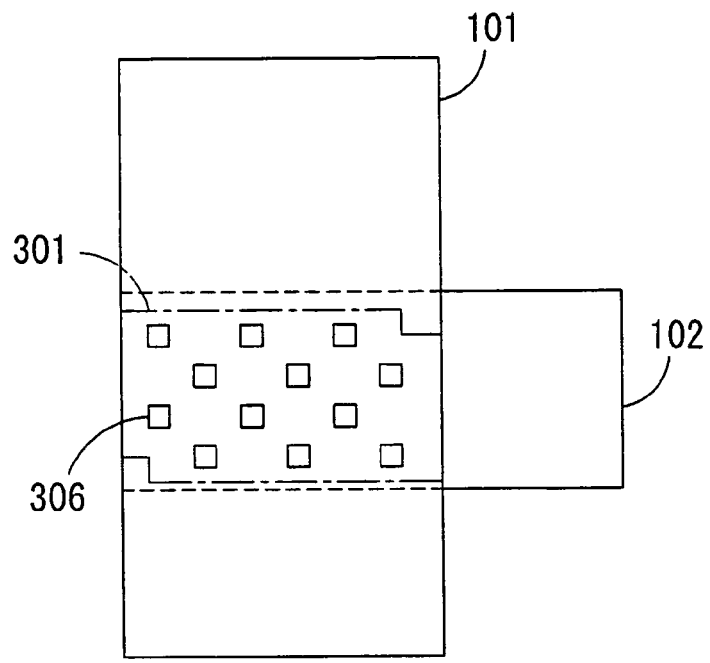
FIG. 3A is a schematic view showing a staggered contact array in a semiconductor integrated circuit according to a third embodiment of the present invention.

In that case, when a contact array is inevitably formed including a larger number of contacts than the number of contacts that can be formed in the unit area determined by the process, to avoid this, wiring is performed by use of a staggered contact array shown in FIG. 3A.

FIG. 3A shows the staggered contact array. In FIG. 3A, reference numeral 101 represents a vertical wiring, reference numeral 102 represents a horizontal wiring of a layer different from that of the wiring 101, and reference numeral 301 represents the staggered contact array. Reference numeral 306 represents contacts arranged in a staggered pattern. The contacts 306 are arranged so that the positions thereof are shifted by half a pitch between in the odd-numbered rows and in the even-numbered rows, or so that the positions thereof are shifted by half a pitch between in the odd-numbered columns and in the even-numbered columns.

Figure 3B:
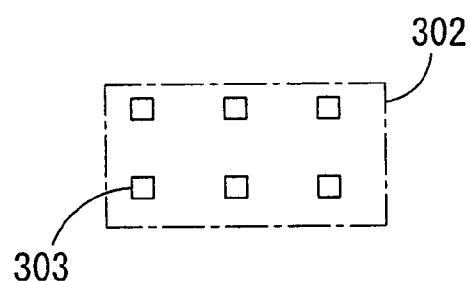
FIG. 3B is a schematic view showing one contact array unit in the semiconductor integrated circuit according to the third embodiment of the present invention.

FIG. 3B shows one of the two contact array units for structuring the staggered contact array 301. In the figure, reference numeral 302 represents a first contact array unit, and reference numeral 303 represents contacts arranged in a matrix pattern.

Figure 3C:
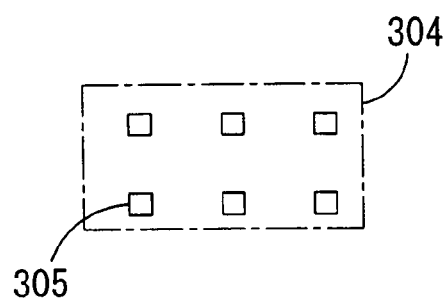
FIG. 3C is a schematic view showing the other contact array unit in the semiconductor integrated circuit according to the third embodiment of the present invention.

FIG. 3C shows the other of the two contact array units for structuring the staggered contact array. In the figure, reference numeral 304 represents a second contact array unit, and reference numeral 305 represents contacts arranged in a matrix pattern.

The staggered contact array 301 is different from the contact array of the prior art in which contacts are regularly formed in numbers that can be formed, with the height, the width and the spacing determined by the process. That is, the first contact array unit 302 and the second contact array unit 304 in which the contacts are formed at spacings larger than the spacing determined by the process both in the horizontal and the vertical directions are placed one on the other so that the contacts are arranged in a staggered pattern.

The staggered contact array 301 comprises, as described above, contacts in the odd-numbered rows and contacts in the even-numbered rows disposed in positions shifted by substantially half a pitch from the contacts in the odd-numbered rows in the direction of the rows. At least one of the contact spacing of the contacts in the odd-numbered rows and the contact spacing of the contacts in the even-numbered rows, and the spacing between the rows of the contacts in the odd-numbered rows and the spacing between the rows of the contacts in the even-numbered rows is larger than the contact formation spacing determined by the manufacturing process.

The contact spacing of the contacts 312 in the odd-numbered rows and the contact spacing of the contacts 313 in the even-numbered rows are set to the same value. The spacing between the rows of the contacts 312 in the odd-numbered rows and the spacing between the rows of the contacts 313 in the even-numbered rows are also set to the same value. The row spacing of the odd-numbered contacts 312 and the row spacing of the even-numbered contacts 313 are set to be the same.

In that case, it is to be noted that the spacing between the contacts constituting the contacts in the odd-numbered rows and the contacts constituting the contacts in the even-numbered rows is set so as not to be smaller than the spacing required by the manufacturing process.

The method described in the second embodiment is effective in preventing coming off of the layer where the contacts are formed and the insulating film in the horizontal and the vertical directions.

However, in a case where contacts are formed with the same size and the same numbers and in the same area, when the contacts are formed according to the structure of the present embodiment, the contacts 306 can be formed at larger spacings both in the vertical and the horizontal directions, and the effect of preventing coming off of the layer where the contacts 306 are formed and the insulating film can be enhanced.

It may be performed to replace, on the wiring result where all the wirings have been formed by use of the contact arrays of the prior art, only the contact array in which the number of contacts that can be formed in the unit area determined by the process is exceeded, with the staggered contact array 301.

While in the above-described embodiment, the contacts are arranged at spacings larger than the spacing determined by the process both in the vertical and the horizontal directions in the first and the second contact array units 302 and 304, the spacing may be larger only in one of the directions.

When the area of the contacts can be reduced to the area of the contacts that can be formed in the unit area determined by the process, similar effects are obtained even if a contact array is used in which the height and the width of the contacts determined by the process are changed. Specifically, the height and the width of the contacts may be increased when the number of contacts is reduced.

By the above-described method, coming off of the layer where the contacts are formed and the insulating film is prevented.

According to the semiconductor integrated circuit structured as described above and the method of manufacturing same, when formed with the same size and the same numbers and in the same area, the contacts can be formed at spacings larger than in the second embodiment in both the vertical and the horizontal directions.

Moreover, the number of contacts in the contact array can be reduced to not more than the number of contacts that can be formed in the unit area determined by the process.

Consequently, coming off of the layer where the contacts are formed and the insulating film and breakage of the LSI can be more prevented.

(Fourth Embodiment)

A fourth embodiment of the present invention will be described with reference to the drawings.

In a verification step of performing verification on the wiring result where all the wirings have been formed by use of the contact arrays of the prior art, whether the number of contacts that can be formed in the unit area determined by the process (the design rule of each process) is exceeded or not is verified in units of regions.

Here, the verification is performed by sweeping the entire area of the chip while allowing overlap of regions of the unit area determined by the manufacturing process, and obtaining the number or the area of contacts formed so as to be vertically and horizontally aligned which contacts are present in the regions of the unit area. Sweeping the entire area of the chip while allowing overlap of regions of the unit area is, specifically, to perform, when the regions of the unit area are sampled, sweeping while successively shifting the region to be sampled in the horizontal and the vertical directions by an amount that is minute compared to the horizontal and the vertical sizes of the region of the unit area.

In that case, when only one contact array is present in the region determined by the process, even if the number of contacts that can be formed in the unit area determined by the process is not exceeded, when another contact array adjoining on the same net is present in the region determined by the process, there are cases where the number of contacts that can be formed in the unit area is exceeded.

Figure 4A:
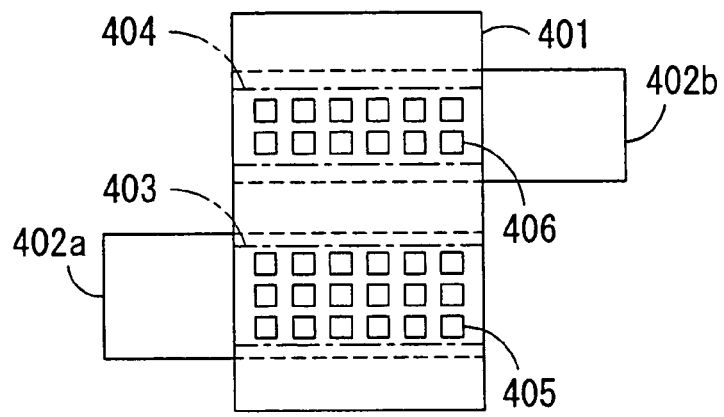
FIG. 4A is a schematic view showing two prior art contact arrays adjoining on the same net.

FIG. 4A shows contact arrays of the prior art adjoining on the same net. In FIG. 4A, reference numeral 401 represents a vertical wiring, reference numerals 402a and 402b represent horizontal wirings of a different layer from the wiring 401, and reference numerals 403 and 404 represent contact arrays of the prior art. Reference numerals 405 and 406 represent contacts provided in the contact arrays 403 and 404 which contacts are arranged in a matrix pattern. The contacts 405 and 406 are regularly formed in numbers that can be formed, with the height, the width and the spacing determined by the process.

The contact array 404 of the prior art is, when used singly, a contact array in which the number of contacts that can be formed in the unit area determined by the process is not exceeded. However, since the contact array 403 adjoining on the same net is present in the region (for example, a rectangular region) determined by the process, the number of contacts that can be formed in the unit area in that region is exceeded.

Therefore, according to the present invention, it is determined whether the contact arrays 403 and 403 adjoining on the same net in the region of the unit area determined by the process are present or not. When the contact arrays 403 and 403 adjoining on the same net in the region of the unit area determined by the process are present, the two contact arrays 403 and 404 are regarded as virtually one contact array.

The number or the area of contacts, arranged in a grid pattern, of the semiconductor integrated circuit which contacts are present in the region of the unit area determined by the process is obtained, and contacts are formed in the region regarded as virtually one contact array as mentioned above by the same method as any of the methods described in the first to the third embodiments so that the number or the area of contacts in the unit area is not more than a predetermined value.

Figure 4B:
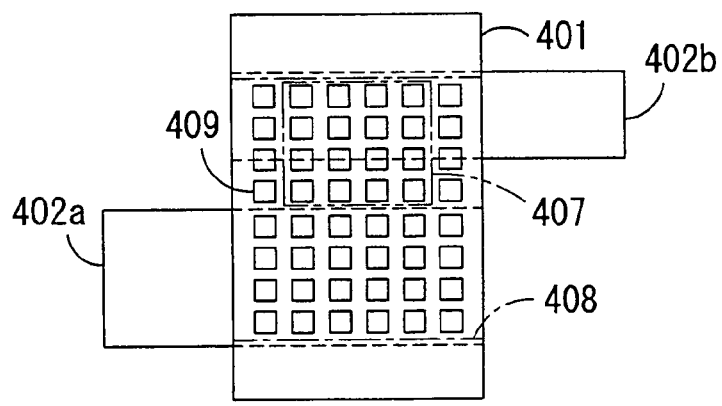
FIG. 4B is a schematic view showing that the two contact arrays of FIG. 4A are regarded as virtually one contact array.

FIG. 4B shows that the two contact arrays 403 and 404 are regarded as virtually one contact array. In FIG. 4B, reference numeral 401 represents a vertical wiring, reference numerals 402a and 402b represent horizontal wirings of a different layer from the wiring 401, and reference numeral 408 represents a virtual contact array. In the virtual contact array 408, adjoining contact arrays on the same net are regarded as one contact array. Reference numeral 409 represents contacts in the virtual contact array 408. Reference numeral 407 represents the region of the unit area.

Figure 4C:
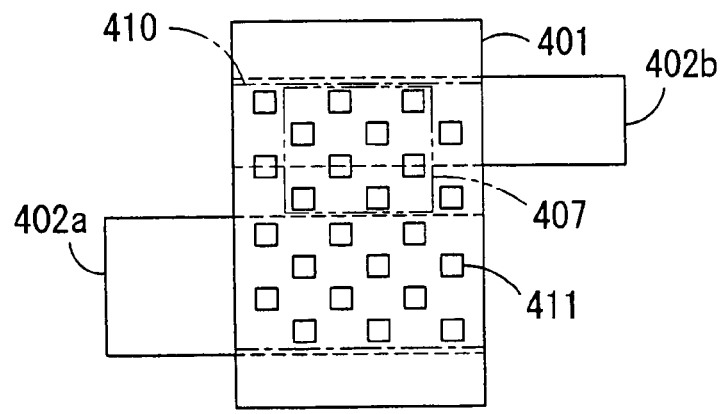
FIG. 4C is a schematic view showing a contact array formed in a fourth embodiment of the present invention.

FIG. 4C shows a contact array where contacts are re-formed. In FIG. 4C, reference numeral 401 represents a vertical wiring, reference numerals 402a and 402b represent horizontal wirings, and reference numeral 410 represents the contact array. Reference numeral 411 represents contacts in the contact array 410. The contacts 411 are arranged, for example, in a staggered pattern (see the third embodiment). The contacts may be formed by a similar method as the method of the first or the second embodiment.

In this embodiment, the contact array 410 is formed in the region of the virtual contact array 408 by the same method to any of the methods described in the first to the third embodiments.

The methods described in the first to the third embodiments are effective in forming a contact array in which the number of contacts that can be formed in the unit area determined by the process is not exceeded. However, since whether the number of contacts that can be formed in the unit area determined by the process is exceeded or not is determined in units of regions determined by the process in the verification after the formation of the wirings, when contact arrays adjoining on the same net are present, there are cases where the number of contacts that can be formed is exceeded. According to the present method, since the processing is performed in units of regions determined by the process, the number of contacts that can be formed is not exceeded even in units of regions.

The following may be performed: After the contact array 406 is formed by the same method as any of the methods described in the first to the third embodiments, the contact array is returned to two contact arrays 501 and 502 having the same size as the original contact arrays 403 and 404 as shown in FIG. 5, and the region between the contact arrays 501 and 502 is used as the region for another wiring.

Figure 5:
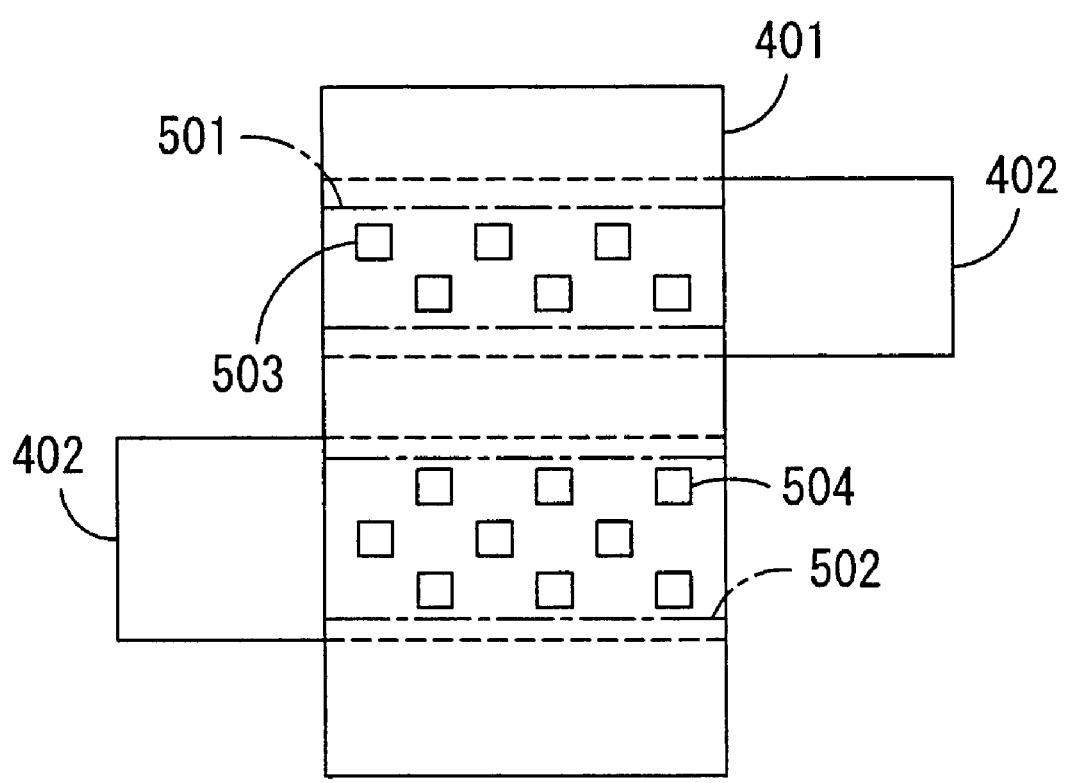
FIG. 5 is a schematic view showing a result of returning the contact array of FIG. 4 to the size of the original contact arrays.

FIG. 5 shows a result of the contact array 410 being returned to the original size. In FIG. 5, reference numeral 401 represents a vertical wiring, reference numeral 402 represents a horizontal wiring, and reference numerals 501 and 502 represent contact arrays. Reference numerals 503 and 504 represent contacts. It is apparent that by returning the contact array to the original size, the region between the contact arrays 501 and 502 can be used by another wiring in the same wiring layer.

In reducing the number of contacts to not more than the number of contacts that can be formed in the unit area determined by the process, when the number of contacts can be further reduced as a result of considering electromigration and IR drop, the number of contacts may be reduced, or may be reduced with some margin being left.

By the above-described method, coming off of the layer where the contacts are formed and the insulating film is prevented.

According to the semiconductor integrated circuit structured as described above and the method of manufacturing same, since the processing is performed in units of regions determined by the process, the number of contacts that can be formed in the unit area is not exceeded even when viewed in units of regions.

Moreover, by forming the contacts 411, 503 and 504 at spacings larger than the spacing determined by the process, the number of contacts in the contact arrays 410, 501 and 502 can be reduced to the number of contacts that can be formed in the unit area determined by the process. Consequently, coming off of the layer where the contacts are formed and the insulating film and breakage of the LSI can be prevented.

(Fifth Embodiment)

A fifth embodiment of the present invention will be described with reference to the drawings.

On the wiring result where all the wirings have been formed by use of the contact arrays of the prior art, a contact array in which the number of contacts that can be formed in the unit area determined by the process is exceeded is formed by the same method as that described in the fourth embodiment. However, when the number of contacts is reduced at the same rate of reduction in large contact arrays and small contact arrays, there are cases where electromigration and an IR drop phenomenon occur because of overreduction of the number of contacts in small contact arrays. For example, by the number of contacts being reduced, connection is broken, and a malfunction of the LSI occurs due to insufficient power supply.

Figure 6A:
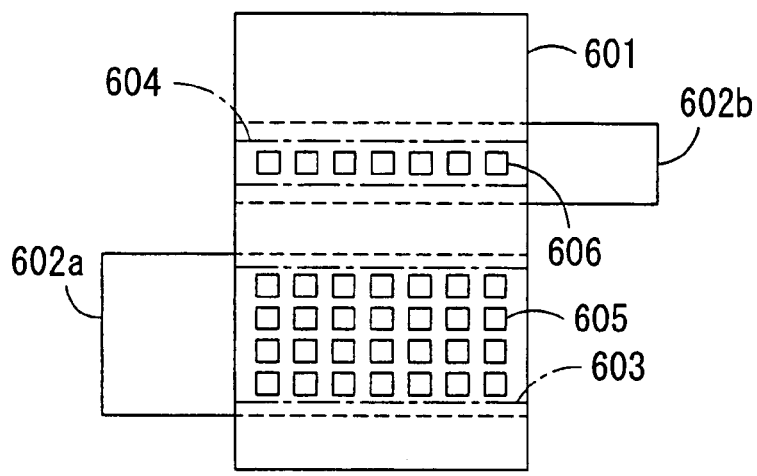
FIG. 6A is a schematic view showing contact arrays of the prior art.

FIG. 6A shows the contact arrays of the prior art. In FIG. 6A, reference numeral 601 represents a vertical wiring, reference numerals 602a and 602b represent horizontal wirings of a layer different from the wiring 601, and reference numerals 603 and 604 represent contact arrays of the prior art. Reference numerals 605 and 606 represent contacts provided in the contact arrays 603 and 604. It is apparent that although the two contacts arrays 603 and 604 are different in size, they are regularly formed in numbers that can be formed, with the height, the width and the spacing determined by the process.

Figure 6B:
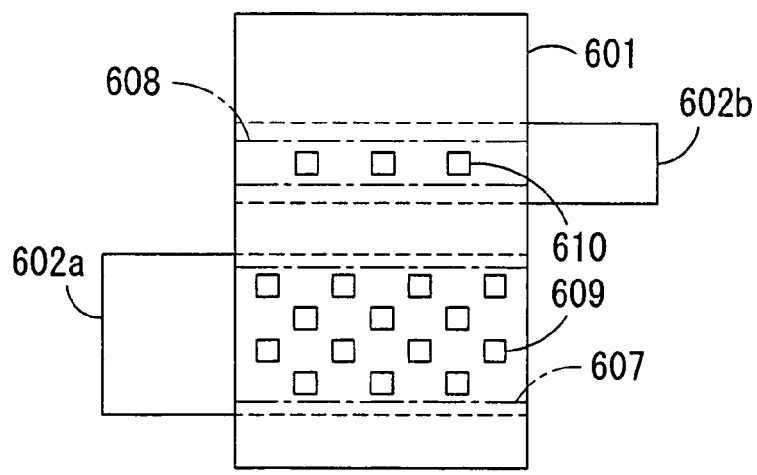
FIG. 6B is a schematic view showing contact arrays formed by any of the methods of the first to the third embodiments.

FIG. 6B shows contact arrays formed by the same method as that described in the fourth embodiment. In FIG. 6B, reference numeral 601 represents a vertical wiring, reference numerals 602a and 602b represent horizontal wirings, and reference numerals 607 and 608 represent contact arrays. Reference numerals 609 and 610 represent contacts provided in the contact arrays 607 and 608. It is apparent that although the contact arrays 607 and 608 are different in size, they are contact arrays that are formed by the same method as that described in the fourth embodiment and in which the number of contacts that can be formed in the unit area determined by the process is not exceeded. Moreover, it is apparent that since the number of contacts is reduced at the same rate of reduction in the contact arrays 607 and 608, in the contact array 608, electromigration and an IR drop phenomenon are likely to occur due to overreduction of the number of contacts 610.

While in the present invention, the number of contacts in each contact array is reduced in order to avoid formation of a number of contacts that exceeds the number of contacts that can be formed in the unit area determined by the process, the contact arrays are formed so that the rate of reduction of the number of contacts is varied according to the size of the contact array.

Figure 6C:
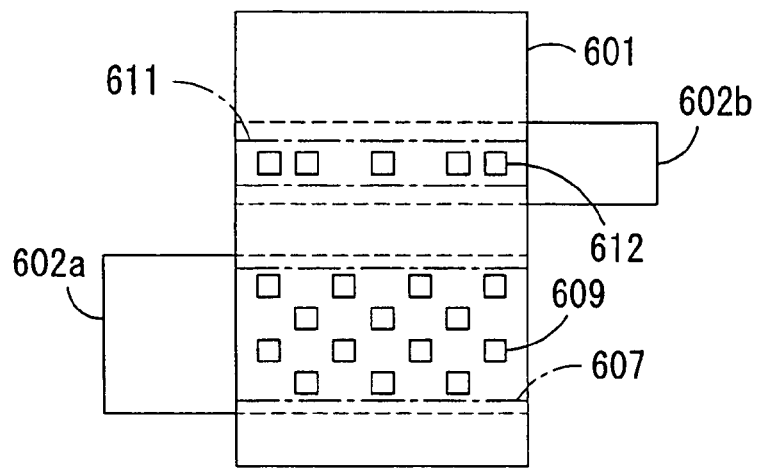
FIG. 6C is a schematic view showing a result of forming contact arrays so that the rate of reduction is varied in a fifth embodiment of the present invention.

FIG. 6C shows a result of forming contact arrays so that the rate of reduction is varied. In FIG. 6C, reference numeral 601 represents a vertical wiring, reference numeral 602 represents a horizontal wiring, and reference numerals 607 and 611 represent contact arrays. Reference numerals 609 and 612 represent contacts. It is apparent that since the rate of reduction of the number of contacts in the contact array 611 is changed, the number of contacts is larger than in the contact array 608 of FIG. 6B.

According to the method described in the fourth embodiment, since the number of contacts is reduced at the same rate of reduction irrespective of the size of the contact array, there are cases where electromigration and an IR drop phenomenon occur due to overreduction of the number of contacts in small contact arrays. According to the present invention, since the rate of reduction of the number of contacts is varied according to the size of the contact array, it can be prevented that electromigration and an IR drop phenomenon occur due to overreduction of the number of contacts 612 in the small contact array 611.

In reducing the number of contacts to not more than the number of contacts that can be formed in the unit area determined by the process, when the number of contacts can be further reduced as a result of considering electromigration and IR drop, the number of contacts may be reduced, or may be reduced with some margin being left.

By the above-described method, coming off of the layer where the contacts are formed and the insulating film is prevented.

According to the semiconductor integrated circuit structured as described above and the method of manufacturing same, since the smaller the area of a contact array is, the lower the rate of reduction of the number of contacts in the contact array is, it can be prevented that electromigration and an IR drop phenomenon occur due to overreduction of the number of contacts in the small contact array.

Moreover, by forming the contacts 609 and 612 at spacings larger than the spacing determined by the process, the number of contacts in the contact arrays 607 and 611 can be reduced to not more than the number of contacts that can be formed in the unit area determined by the process. Consequently, coming off of the layer where the contacts 609 and 612 are formed and the insulating film and breakage of the LSI can be prevented.

(Sixth Embodiment)

A sixth embodiment of the present invention will be described with reference to the drawings.

When contact arrays are viewed in units of small regions, resistance to film coming off is higher when contacts are formed with the height, the width and the spacing determined by the process like the contact array of the prior art. However, when a large number of contacts are formed with the height, the width and the spacing determined by the process like the contact array of the prior art, coming off of the layer where the contacts are formed and the insulating film are likely to occur.

According to the present invention, after all the wirings have been formed by use of the contact arrays of the prior art, the region, where contacts are formed, of the contact array in which the number of contacts that can be formed in the unit area determined by the process is exceeded is divided into two or more regions, and in some of the regions, contacts are formed with the height, the width and the spacing determined by the process like the prior art. In the remaining regions, contacts are formed by the same method as any of the methods described in the first to the third embodiments.

Figure 7A:
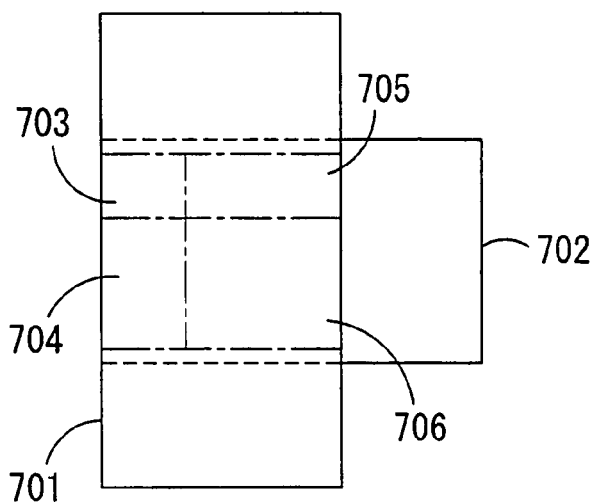
FIG. 7A is a schematic view showing a result of dividing the region where contacts are formed, into two or more regions in a sixth embodiment of the present invention.

FIG. 7A shows a result of dividing the region where a contact array is formed, into two or more regions (in this example, four regions). In FIG. 7A, reference numeral 701 represents a vertical wiring, reference numeral 702 represents a horizontal wiring of a layer different from the wiring 701, reference numeral 703 represents a first divisional contact array region, reference numeral 704 represents a second divisional contact array region, reference numeral 705 represents a third divisional contact array region, and reference numeral 705 represents a fourth divisional contact array region. It is apparent that the region where a contact array is formed is divided into two or more regions.

Figure 7B:
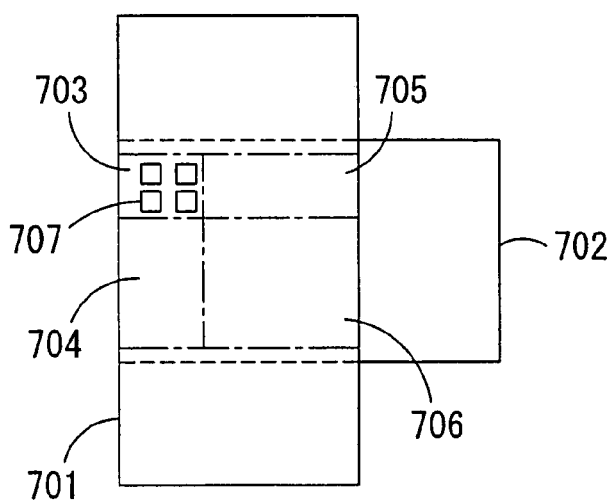
FIG. 7B is a schematic view showing a result of forming contacts of the prior art in a first contact array divisional region in the sixth embodiment of the present invention.

FIG. 7B shows a result of forming the contacts of the prior art in the first contact array divisional region 703. In FIG. 7B, reference numeral 701 represents the vertical wiring, reference numeral 702 represents the horizontal wiring, reference numeral 703 represents the first contact array divisional region, reference numeral 704 represents the second contact array divisional region, reference numeral 705 represents the third contact array divisional region, reference numeral 706 represents the fourth contact array divisional region, and reference numeral 707 represents the contacts of the prior art. It is apparent that in the first contact array divisional region 703, the contacts 707 are formed with the height, the width and the spacing determined by the process like the prior art.

Figure 7C:
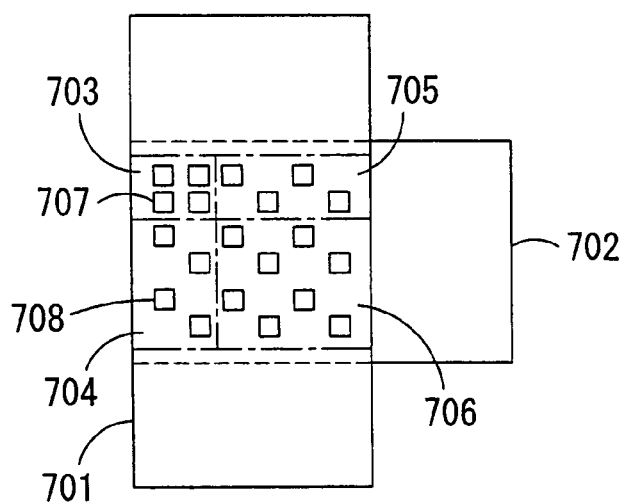
FIG. 7C is a schematic view showing a result of forming contacts also in a second to a fourth contact array divisional region other than the first contact array divisional region in the sixth embodiment of the present invention.

FIG. 7C shows a result of forming contacts also in the regions other than the first contact array divisional region 703. In FIG. 7C, reference numeral 701 represents the vertical wiring, reference numeral 702 represents the horizontal wiring, reference numeral 703 represents the first contact array divisional region, reference numeral 704 represents the second contact array divisional region, reference numeral 705 represents the third contact array divisional region, reference numeral 706 represents the fourth contact array divisional region, reference numeral 707 represents the contacts of the prior art, and reference numeral 708 represents contacts formed by the same method as any of the methods described in the first to the third embodiments. It is apparent that the contacts 708 are formed by any of the methods described in the first to the third embodiments in the regions 704 to 706 other than the first contact array divisional region.

The structures formed by the methods described in the first to the third embodiments cannot be said to be resistant to film coming off because no contact region formed by a similar method to that of the prior art is present in the contact array. According to the present invention, a structure that is resistant to film coming off can be obtained by forming contacts with the height, the width and the spacing determined by the process like the prior art in some of the regions of the contact array, so that film coming off can be prevented.

In reducing the number of contacts to not more than the number of contacts that can be formed in the unit area determined by the process, when the number of contacts can be further reduced as a result of considering electromigration and IR drop, the number of contacts in the regions other than the region of the contacts of the prior art are formed may be reduced, or may be reduced with some margin being left.

By the above-described method, coming off of the layer where the contacts are formed and the insulating film is prevented.

According to the semiconductor integrated circuit structured as described above and the method of manufacturing same, in some of the regions of the contact array, contacts are formed with the height, the width and the spacing determined by the process like the prior art, so that a structure that is resistant to film coming off can be obtained. Consequently, film coming off can be prevented.

Moreover, by forming contacts at spacings larger than the spacing determined by the process in the remaining regions of the contact array, the number of contacts in the contact array can be reduced to not more than the number of contacts that can be formed in the unit area determined by the process. Consequently, coming off of the layer where the contacts are formed and the insulating film and breakage of the LSI can be prevented.

While in the first contact array divisional region 703, contacts are formed with the height, the width and the spacing determined by the process in the above-described embodiment, contacts maybe formed with a height, a width and a spacing larger than them. In this case, a structure that is resistant to film coming off can be obtained. However, it is necessary that the height, the width and the spacing of the contacts of the contact array divisional region 703 be smaller than those of the contacts of the contact array divisional regions 704 to 706.

Moreover, the contact arrays may be formed by specifying the position of each contact (hole) after calculating the coordinates thereof.

(Seventh Embodiment)

A seventh embodiment of the present invention will be described with reference to the drawings.

When contact arrays are viewed in units of small regions, resistance to film coming off is higher when contacts are formed with the height, the width and the spacing determined by the process like the contact array of the prior art. However, when a large number of contacts are formed with the height, the width and the spacing determined by the process like the contact array of the prior art, coming off of the layer where the contacts are formed and the insulating film are likely to occur.

According to the present invention, after all the wirings have been formed by use of the contact array of the prior art, the region, where contacts are formed, of the contact array in which the number of contacts that can be formed in the unit area determined by the process is exceeded is divided into three or more regions, the number of contacts that can be formed in the unit area determined by the process is obtained, and contacts are formed with the height, the width and the spacing determined by the process like the prior art at predetermined region spacings so that the number of contacts that can be formed in the unit area determined by the process is not exceeded.

The predetermined region spacing is decided by examining the region spacing with which contacts are well-balancedly formed from the total number of contacts formed in the contact array, the number of regions where contacts are formed and the area of the regions. With respect to being well-balancedly formed, since it is not good in balance if contacts are formed only in the region in the uppermost layer and not formed in the middle and the lowermost layers, viewing the entire area of the contact array, contacts are well-balancedly formed. Ideally, it is desirable that the contacts be arranged in a staggered pattern of FIG. 8B.

Figure 8A:
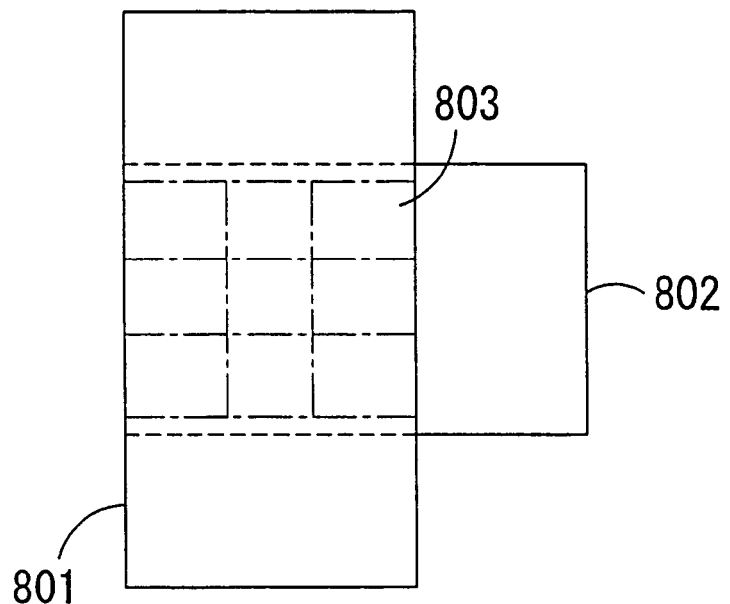
FIG. 8A is a schematic view showing a result of dividing the region where a contact array is formed, into three or more regions in a seventh embodiment of the present invention.

FIG. 8A shows a result of dividing the region where the contacts are formed, into three or more regions. In FIG. 8A, reference numeral 801 represents a vertical wiring, reference numeral 802 represents a horizontal wiring of a different layer from the wiring 801, and reference numeral 803 represents a plurality of contact array divisional regions. It is apparent that the region where the contacts are formed is divided into three or more regions.

Figure 8B:
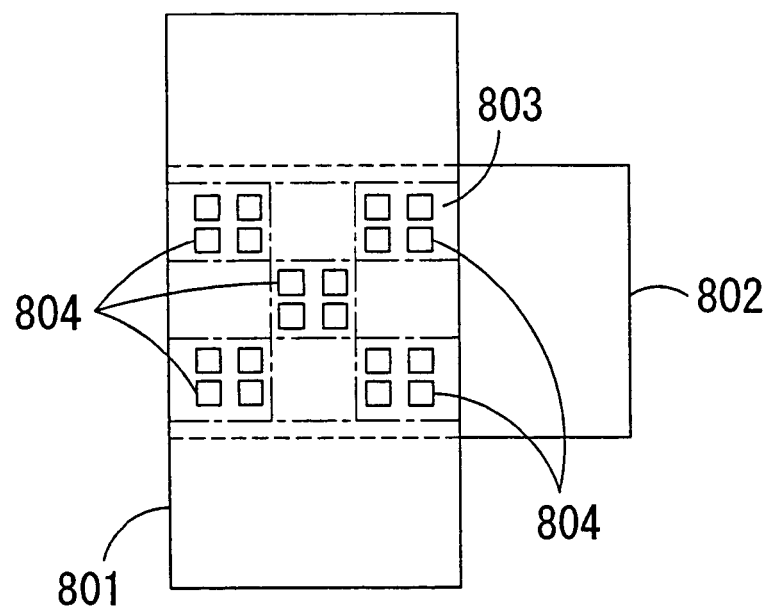
FIG. 8B is a schematic view showing a result of forming contacts of the prior art at predetermined region spacings in the seventh embodiment of the present invention.

FIG. 8B shows a result of forming the contacts of the prior art at the predetermined region spacings. In FIG. 8B, reference numeral 801 represents the vertical wiring, reference numeral 802 represents the horizontal wiring, reference numeral 803 represents the plural contact array divisional regions, and reference numeral 804 represents contacts of the prior art. It is apparent that contacts are formed with the height, the width and the spacing determined by the process like the prior art at the predetermined region spacings in the plural contact array divisional regions 803.

While according to the method described in the sixth embodiment, film coming off does not readily occur because contacts are formed only in some of the contact array regions by a similar method to that of the prior art, according to the present invention, all of the contacts to be formed are formed with the height, the width and the spacing determined by the process like the prior art in the plural contact array divisional regions 803 of the contact array arranged at predetermined region spacings, so that a structure that is resistant to film coming off can be obtained. Consequently, film coming off can be more firmly prevented.

In reducing the number of contacts to not more than the number of contacts that can be formed in the unit area determined by the process, when the number of contacts can be further reduced as a result of considering electromigration and IR drop, the number of contacts may be reduced, or may be reduced with some margin being left.

By the above-described method, coming off of the layer where the contacts are formed and the insulating film is prevented.

According to the method of preventing film coming off of a semiconductor integrated circuit structured as described above, contacts are formed with the height, the width and the spacing determined by the process like the prior art in the plural contact array divisional regions 803 of the contact array at predetermined region spacings, so that film coming off can be more firmly prevented.

Moreover, the number of contacts in the contact array can be reduced to not more than the number of contacts that can be formed in the unit area determined by the process. Consequently, coming off of the layer where the contacts 804 are formed and the insulating film and breakage of the LSI can be prevented.

While in the contact array divisional regions 803, contacts are formed with the height, the width and the spacing determined by the process in the above-described embodiment, contacts maybe formed with a height, a width and a spacing larger than them. In this case, a structure that is resistant to film coming off can be obtained.

Moreover, the contact arrays may be formed by specifying the position of each contact (hole) after calculating the coordinates thereof.

(Eighth Embodiment)

An eighth embodiment of the present invention will be described with reference to the drawings.

When the wiring layer of a first layer to the wiring layer of a fifth layer are changed at a time, using contact arrays of the prior art, four contact arrays are longitudinally laminated from the first to a second layer, from the second to a third layer, from the third to a fourth layer and from the fourth to the fifth layer, thereby establishing connection between the wiring layer of the first layer and the wiring layer of the fifth layer. Consequently, the contact arrays are great obstacles that longitudinally run through the semiconductor wafer, so that the wiring resources are insufficient and this results in unconnected wirings.

Figure 9:
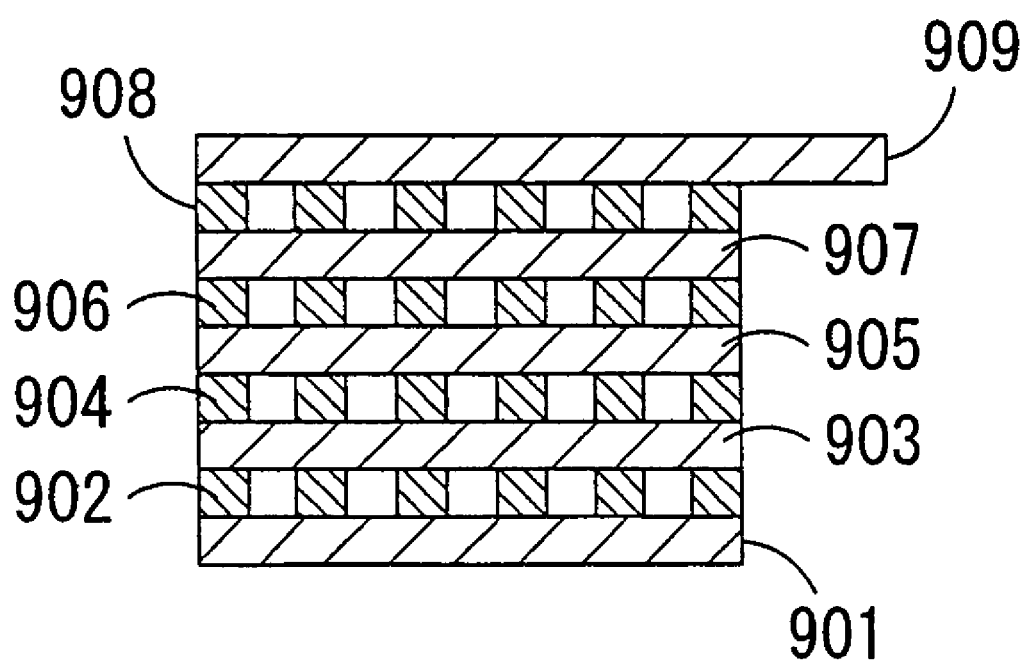
FIG. 9 is a cross-sectional view showing that contact arrays of the prior art are laminated to thereby establish connection.

FIG. 9 is a cross-sectional view showing that the wiring layer of the first layer and the wiring layer of the fifth layer are connected together by longitudinally laminating the contact arrays of the prior art. In FIG. 9, reference numeral 901 represents a first layer wiring, reference numeral 903 represents a second layer wiring, reference numeral 905 represents a third layer wiring, reference numeral 907 represents a fourth layer wiring, and reference numeral 909 represents a fifth layer wiring. Reference numeral 902 represents a contact array connecting the first layer wiring 901 and the second layer wiring 903. Reference numeral 904 represents a contact array connecting the second layer wiring 903 and the third layer wiring 905. Reference numeral 906 represents a contact array connecting the third layer wiring 905 and the fourth layer wiring 907. Reference numeral 908 represents a contact array connecting the fourth layer wiring 907 and the fifth layer wiring 909. It is apparent that by the four contact arrays being longitudinally laminated, connection is established between the first layer wiring 901 and the fifth layer wiring 909.

According to the present invention, on the wiring result where all the wirings have been formed by use of the contact arrays of the prior art, contact arrays are re-formed by the same method as any of the methods described in the first to the third embodiment. Then, when only contacts in the contact arrays 904 and 906 of the intermediate layers not directly connected to the wirings are re-formed at the spacings not less than the spacings determined by the process and the wirings of the intermediate layers are also reduced to a size necessary for re-forming contacts, it is determined whether the number of contacts that can be formed in the unit area determined by the process is exceeded or not.

When the number of contacts that can be formed in the unit area determined by the process is not exceeded, contacts are formed at the spacings not less than the spacings determined by the process, and the wirings of the intermediate layers are reduced to the size necessary for re-forming contacts.

Figure 10A:
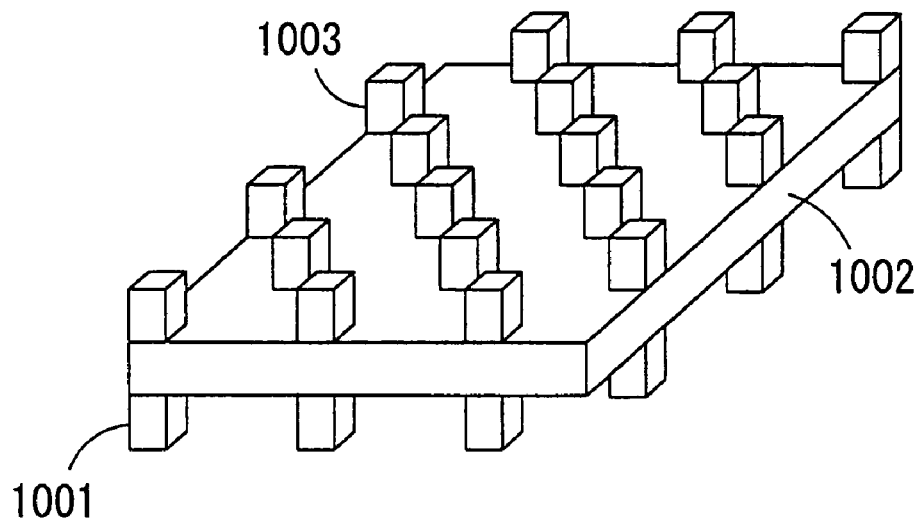
FIG. 10A is a single view drawing showing contact arrays of intermediate layers in an eighth embodiment of the present invention.

FIG. 10A is a single view drawing showing contact arrays of intermediate layers. In FIG. 10A, reference numeral 1002 represents a third layer wiring, reference numeral 1001 represents a contact array connecting a second layer wiring (not shown) and the third layer wiring 1002, and reference numeral 1003 represents a contact array connecting the third layer wiring 1002 and a fourth layer wiring (not shown). In FIG. 10A, it is apparent that contacts are re-formed by the same method as any of the methods described in the first to the third embodiments in the contact arrays 1001 and 1003 (in FIG. 10A, the example shown in the third embodiment is shown).

Figure 10B:
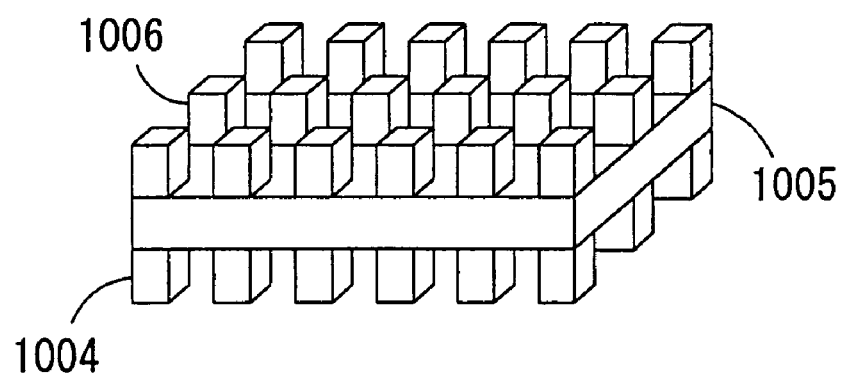
FIG. 10B is a single view drawing showing re-formed contact arrays in the eighth embodiment of the present invention.

FIG. 10B is a single view drawing showing re-formed contact arrays. In FIG. 10B, reference numeral 1005 represents a third layer wiring, reference numeral 1004 represents a contact array connecting a second layer wiring and the third layer wiring 1005, and reference numeral 1006 represents a contact array connecting the third layer wiring 1005 and a fourth layer wiring. In FIG. 10B, it is apparent that contacts are re-formed at the spacings not less than the spacings determined by the process in the contact arrays 1004 and 1006 and the wirings of the intermediate layers are reduced to a size necessary for re-forming contacts.

Figure 11:
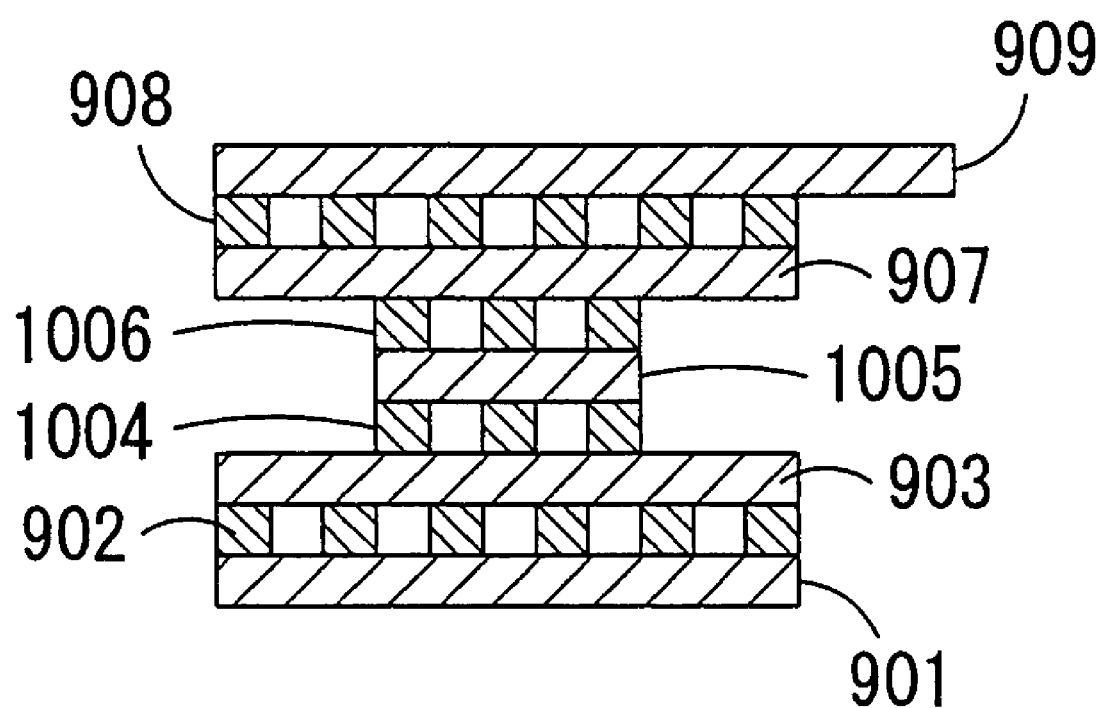
FIG. 11 is a single view drawing showing a result of reducing the contact arrays of the intermediate layers in size in the eighth embodiment of the present invention.

FIG. 11 is a cross-sectional view showing a result of reducing the contact arrays of the intermediate layers in size. In FIG. 11, reference numeral 901 represents the first wiring layer, reference numeral 903 represents the second layer wiring, reference numeral 1005 represents the third layer wiring, reference numeral 907 represents the fourth layer wiring, and reference numeral 909 represents the fifth layer wiring. Reference numeral 902 represents the contact array connecting the first layer wiring 901 and the second layer wiring 903. Reference numeral 1004 represents the contact array connecting the second layer wiring 903 and the third layer wiring 1005. Reference numeral 1006 represents the contact array connecting the third layer wiring 1005 and the fourth layer wiring 907. Reference numeral 908 represents the contact array connecting the fourth layer wiring 907 and the fifth layer wiring 909.

It is apparent that since the contact array 1004, the third layer wiring 1005 and the contact array 1006 are reduced in size because of the re-formation of the contacts at the spacings not less than the spacings determined by the process, the sides of the contact array 1004, the third layer wiring 1005 and the contact array 1006 can be used as wiring regions by other wirings in the same wiring layer.

While according to the methods described in the first to the third embodiments, the contact arrays of the intermediate layers have the same size as the contact arrays directly connected to the wirings, according to the present invention, the contact arrays of the intermediate layers are reduced in size when possible, and the sides of the contact arrays of the intermediate layers can be used as wiring regions by other wirings in the same wiring layer, so that it can be prevented that wirings are unconnected because of insufficient wiring resources.

Figure 12:
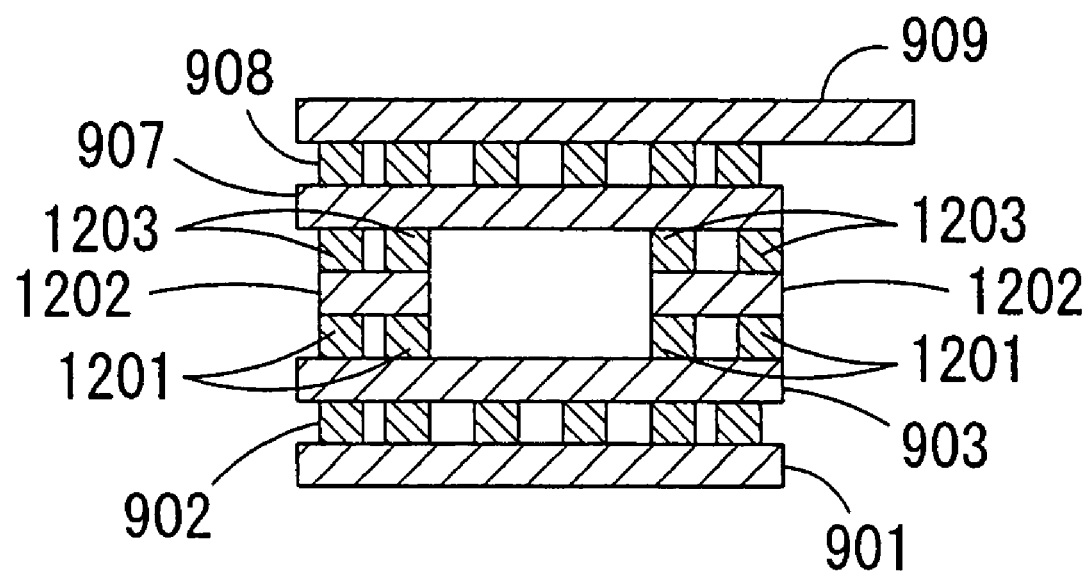
FIG. 12 is a cross-sectional view showing a result of dividing the contact arrays of the intermediate layers into a plurality of contact arrays in the eighth embodiment of the present invention.
Figure 13:
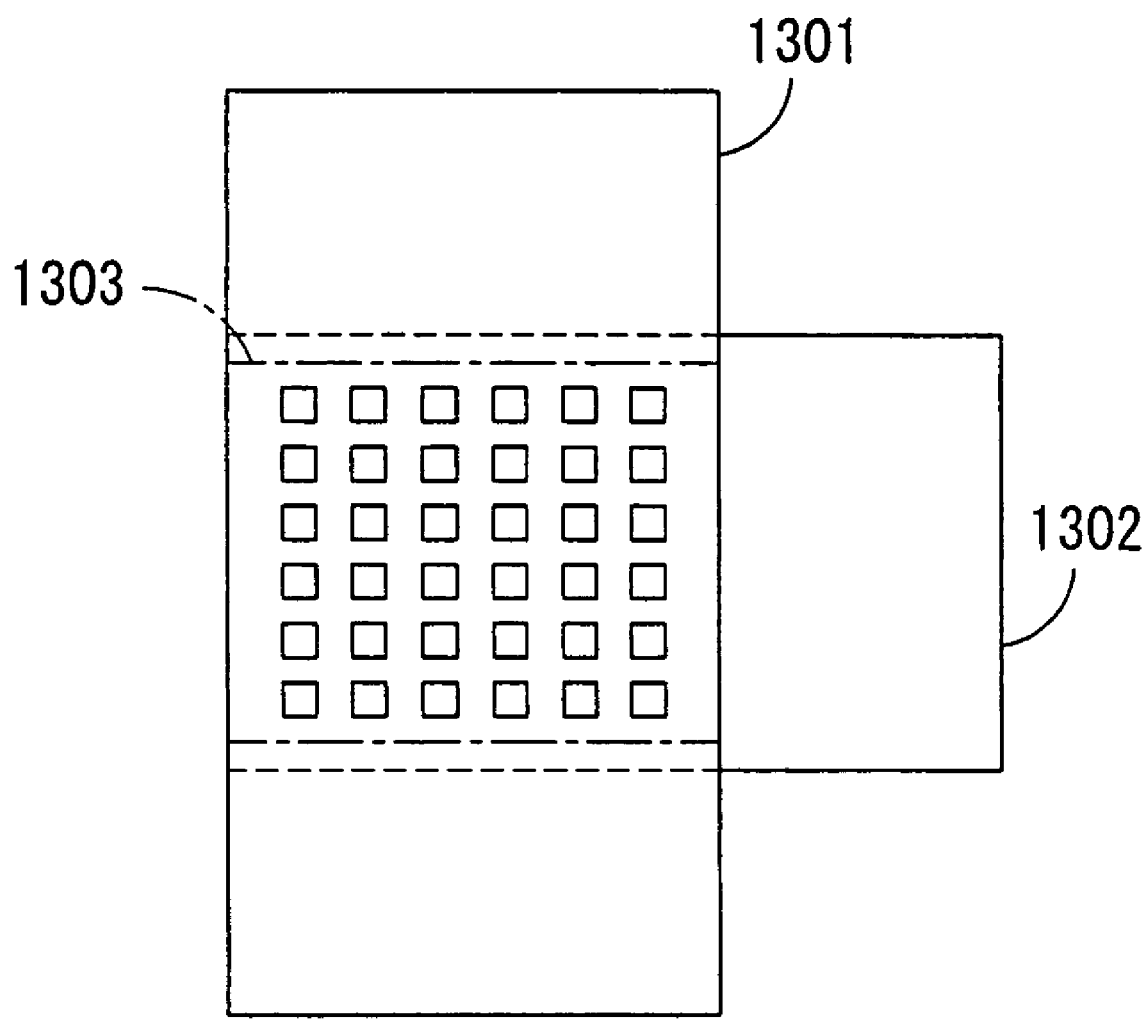
FIG. 13 is a schematic view showing the contact array of the prior art.

When the contact arrays of the intermediate layers not directly connected to the wirings are re-formed and the wirings of the intermediate layers are also reduced in size, in a case where the number of contacts that can be formed in the unit area determined by the process is exceeded, as shown in FIG. 12, the contact arrays may be divided into a plurality of contact arrays in which the number of contacts that can be formed in the unit area determined by the process is not exceeded.

FIG. 12 is a cross-sectional view showing a result of dividing the contact arrays into a plurality of contact arrays. In FIG. 12, reference numeral 901 represents the first layer wiring, reference numeral 903 represents the second layer wring, reference numeral 1202 represents a third layer wring, reference numeral 907 represents the fourth layer wiring, and reference numeral 909 represents the fifth layer wiring. Reference numeral 902 represents the contact array connecting the first layer wiring 901 and the second layer wring 903. Reference numeral 1201 represents a contact array connecting the second layer wiring 903 and the third layer wiring 1202. Reference numeral 1203 represents a contact array connecting the third layer wiring 1202 and the fourth layer wiring 907. Reference numeral 908 represents the contact array connecting the fourth layer wiring 907 and the fifth layer wiring 909.

It is apparent that since the contact array 1201, the third layer wiring 1202 and the contact array 1203 are divided into a plurality of parts, the space among the contact array 1201, the third layer wiring 1202 and the contact array 1203 can be used as a wiring region by another wiring in the same wiring layer.

In a case where, on the wiring result, contact arrays are re-formed by the same method as any of the methods described in the first to the third embodiment, when only contacts in the contact arrays of the intermediate layers not directly connected to the wirings are re-formed at the spacings not less than the spacings determined by the process and the wirings of the intermediate layers are also reduced to a size necessary for re-forming contacts, it is virtually determined whether the number of contacts that can be formed in the unit area determined by the process is exceeded or not. When the number of contacts that can be formed in the unit area determined by the process is not exceeded, it may be performed to form contacts at the spacings determined by the process and reduce the wirings of the intermediate layers to the size necessary for re-forming contacts.

By the above-described method, coming off of the layer where the contacts are formed and the insulating film is prevented.

According to the semiconductor integrated circuit structured as described above and the method of manufacturing same, the contact arrays of the intermediate layers are reduced in size when possible, and the same wiring layer on the sides of the contact arrays of the intermediate layers can be used as wiring regions by other wirings, so that it can be prevented that wirings are unconnected because of insufficient wiring resources.

Moreover, by forming contacts at spacings larger than the spacing determined by the process, the number of contacts in the contact array can be reduced to not more than the number of contacts that can be formed in the unit area determined by the process. Consequently, coming off of the layer where the contacts are formed and the insulating film and breakage of the LSI can be prevented.

(Ninth Embodiment)

A ninth embodiment of the present invention will be described with reference to the drawings.

Like the method described in the first embodiment, wirings are formed by use of the design rule determined by the process. According to the design rule determined by the process, contacts are regularly formed in numbers that can be formed, in a matrix pattern with the height, the width and the spacing determined by the process.

Figure 14A:
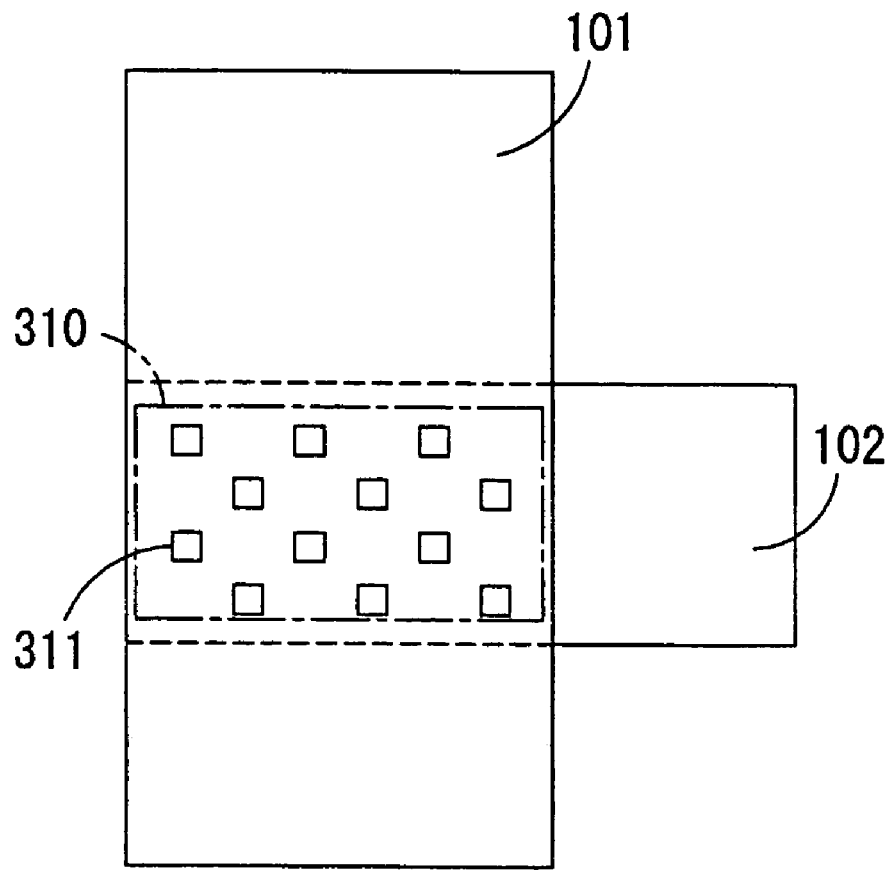
FIG. 14A is a schematic view showing a staggered contact array in a semiconductor integrated circuit according to a ninth embodiment of the present invention.

In that case, when a contact array is inevitably formed including a larger number of contacts than the number of contacts that can be formed in the unit area determined by the process, to avoid this, wiring is performed by use of a staggered contact array shown in FIG. 14A.

FIG. 14A shows the staggered contact array. In FIG. 14A, reference numeral 101 represents a vertical wiring, reference numeral 102 represents a horizontal wiring of a layer different from that of the wiring 101, and reference numeral 310 represents the staggered contact array. Reference numeral 311 represents contacts arranged in a staggered pattern. The contacts 311 are arranged so that the positions thereof are shifted by half a pitch between in the odd-numbered rows and in the even-numbered rows, or so that the positions thereof are shifted by half a pitch between in the odd-numbered columns and in the even-numbered columns.

Figure 14B:
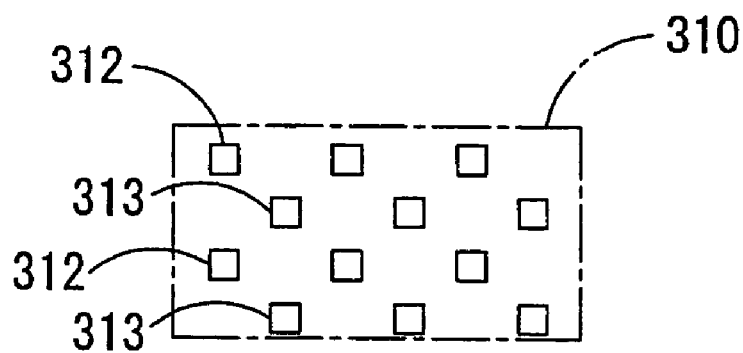
FIG. 14B is a schematic view showing a contact array unit in the semiconductor integrated circuit according to the ninth embodiment of the present invention.

FIG. 14B shows only the staggered contact array 310. In the figure, reference numeral 312 represents contacts in the odd-numbered rows. Reference numeral 313 represents contacts in the even-numbered rows. The staggered contact array 310 comprises, as described above, the contacts 312 in the odd-numbered rows and the contacts 313 in the even-numbered rows disposed in positions shifted by substantially half a pitch from the contacts 312 in the odd-numbered rows in the direction of the rows. At least one of the contact spacing of the contacts 312 in the odd-numbered rows and the contact spacing of the contacts 313 in the even-numbered rows, and the spacing between the rows of the contacts 312 in the odd-numbered rows and the spacing between the rows of the contacts 313 in the even-numbered rows is larger than the contact formation spacing determined by the manufacturing process.

The contact spacing of the contacts 312 in the odd-numbered rows and the contact spacing of the contacts 313 in the even-numbered rows are set to the same value. The spacing between the rows of the contacts 312 in the odd-numbered rows and the spacing between the rows of the contacts 313 in the even-numbered rows are also set to the same value. The row spacing of the odd-numbered contacts 312 and the row spacing of the even-numbered contacts 313 are set to be the same.

In the staggered contact array 310, the contacts 311 are arranged in a staggered pattern on one contact array by disposing the contacts 311 at different spacings between in the vertical and the horizontal directions, calculating different offset positions between in the odd- and the even-numbered lines and specifying the calculated offset positions.

As another method, the staggered contact array 310 may be formed by specifying the position of each contact (hole) after calculating the coordinates thereof.

In that case, it is to be noted that the spacing between the contacts constituting the contacts 312 in the odd-numbered rows and the contacts constituting the contacts 313 in the even-numbered rows is set so as not to be smaller than the spacing required by the manufacturing process.

The method described in the second embodiment is effective in preventing coming off of the layer where the contacts are formed and the insulating film in the horizontal and the vertical directions.

However, in a case where contacts are formed with the same area and the same size and in the same numbers, when the contacts are formed according to the structure of the present embodiment, the contacts 311 can be formed at larger spacings both in the vertical and the horizontal directions, and the effect of preventing coming off of the layer where the contacts 311 are formed and the insulating film can be enhanced.

It may be performed to replace, on the wiring result where all the wirings have been formed by use of the contact arrays of the prior art, only the contact array in which the number of contacts that can be formed in the unit area determined by the process is exceeded, with the staggered contact array 310.

When the area of the contacts can be reduced to the area of the contacts that can be formed in the unit area determined by the process, similar effects are obtained even if a contact array is used in which the height and the width of the contacts determined by the process are changed. Specifically, the height and the width of the contacts may be increased when the number of contacts is reduced.

According to the method of preventing film coming off of a semiconductor integrated circuit structured as described above, when formed with the same area and the same size and in the same numbers, the contacts can be formed at spacings larger than in the second embodiment in both the vertical and the horizontal directions.

Moreover, the number of contacts in the contact array can be reduced to not more than the number of contacts that can be formed in the unit area determined by the process. Consequently, coming off of the layer where the contacts are formed and the insulating film and breakage of the LSI can be more prevented.

What is claimed is:

1. A semiconductor integrated circuit having a contact array between wiring layers in which a plurality of contacts is formed so as to be aligned in a vertical direction and a horizontal direction, wherein a contact formation spacing in one of the vertical and the horizontal directions in the contact array is larger than a contact formation spacing determined by a manufacturing process.

2. A semiconductor integrated circuit having a contact array between wiring layers in which a plurality of contacts is formed so as to be aligned in a vertical direction and a horizontal direction, wherein a contact formation spacing in both of the vertical and the horizontal directions in the contact array is larger than a contact formation spacing determined by a manufacturing process.

3. A semiconductor integrated circuit having a contact array between wiring layers in which a plurality of contacts is formed so as to be aligned in a vertical direction and a horizontal direction, wherein the contact array is formed by placing a first contact array unit and a second contact array unit one on another, the first and the second contact array units have a structure in which a plurality of contacts is formed so as to be aligned in the vertical and the horizontal directions, a contact formation spacing in at least one of the vertical and the horizontal directions in each of the first and the second contact array units is larger than a contact formation spacing determined by a manufacturing process, and the first and the second contact array units are placed one on another so as to be shifted from each other so that contact formation positions of the first contact array unit are situated midway between contact formation positions of the second contact array unit both in the vertical and the horizontal directions.

4. A semiconductor integrated circuit having a contact array between wiring layers in which a plurality of contacts is formed so as to be aligned in a vertical direction and a horizontal direction, wherein an entire area of a chip is sampled while sampling area, which is determined by a manufacturing process, is successively shifted such that the shifted sampling area overlaps with the previous sampling area, a number or an area of the contacts toned so as to be aligned in the vertical and the horizontal directions which contacts are present in the regions of the unit area is obtained, and a contact formation spacing is increased so that the number or the area of the contacts included in the regions of the unit area is not more than a predetermined value.

5. A semiconductor integrated circuit according to claim 1, wherein a rate of reduction, relative to the manufacturing process, of the number of contacts when the contact formation spacing is increased is varied according to a size of the contact array.

6. A semiconductor integrated circuit according to claim 2, wherein a rate of reduction of the number of contacts when the contact formation spacing is increased is varied according to a size of the contact array.

7. A semiconductor integrated circuit according to claim 3, wherein a rate of reduction of the number of contacts when the contact formation spacing is increased is varied according to a size of the contact array.

8. A semiconductor integrated circuit according to claim 4, wherein a rate of reduction of the number of contacts when the contact formation spacing is increased is varied according to a size of the contact array.

9. A semiconductor integrated circuit having a contact array in which a plurality of contacts is formed so as to be aligned in a vertical direction and a horizontal direction, wherein the contact array is divided into at least two contact array regions, and in at least one of the contact array regions, the contacts are formed at spacings not less than contact formation spacings determined by a manufacturing process and in a remaining contact array region, the contacts are formed at contact formation spacings larger than the contact formation spacing in the at least one of the contact array regions.

10. A semiconductor integrated circuit having a contact array in which a plurality of contacts is formed so as to be aligned in a vertical direction and a horizontal direction, wherein the contact array is divided into at least three contact array regions, a number or an area of the contacts present in a region of a unit area is obtained, and the contacts are formed at spacings not less than contact formation spacings determined by a manufacturing process in each of at least two of the contact array regions arranged at predetermined region spacings so that the number or the area of contacts included in the region of the unit area is not more than a predetermined value.

11. A semiconductor integrated circuit according to claim 1, wherein at least three layers of contact arrays are longitudinally laminated, and in a contact array of an intermediate layer, as a result of increasing a contact formation spacing, contacts remaining in the contact array of the intermediate layer are re-arranged at spacings not less than contact spacings determined by a process, whereby a region of the contact array of the intermediate layer is smaller than regions of contact arrays of an uppermost layer and a lowermost layer.

12. A semiconductor integrated circuit according to claim 2, wherein at least three layers of contact arrays are longitudinally laminated, and in a contact array of an intermediate layer, as a result of increasing a contact formation spacing, contacts remaining in the contact array of the intermediate layer are re-arranged at spacings not less than contact spacings determined by a process, whereby a region of the contact array of the intermediate layer is smaller than regions of contact arrays of an uppermost layer and a lowermost layer.

13. A semiconductor integrated circuit according to claim 3, wherein at least three layers of contact arrays are longitudinally laminated, and in a contact array of an intermediate layer, as a result of increasing a contact formation spacing, contacts remaining in the contact array of the intermediate layer are re-arranged at spacings not less than contact spacings determined by a process, whereby a region of the contact array of the intermediate layer is smaller than regions of contact arrays of an uppermost layer and a lowermost layer.

14. A semiconductor integrated circuit according to claim 4, wherein at least three layers of contact arrays are longitudinally laminated, and in a contact array of an intermediate layer, as a result of increasing a contact formation spacing, contacts remaining in the contact array of the intermediate layer are re-arranged at spacings not less than contact spacings determined by a process, whereby a region of the contact array of the intermediate layer is smaller than regions of contact arrays of an uppermost layer and a lowermost layer.

15. A method of manufacturing a semiconductor integrated circuit having a contact array between wiring layers in which a plurality of contacts is formed so an to be aligned in a vertical direction and a horizontal direction, wherein a contact formation spacing in one of the vertical and the horizontal directions in the contact array is larger than a contact formation spacing determined by a manufacturing process.

16. A method of manufacturing a semiconductor integrated circuit having a contact array between wiring layers in which a plurality of contacts is formed so as to be aligned in a vertical direction and a horizontal direction, wherein a contact formation spacing in both of the vertical and the horizontal directions in the contact array is larger than a contact formation spacing determined by a manufacturing process.

17. A method of manufacturing a semiconductor integrated circuit having a contact array in which a plurality of contacts is formed so as to be aligned in a vertical direction and a horizontal direction, wherein when the contact array is formed by placing one on another a first contact array unit and a second contact array unit in which a plurality of contacts is formed so as to be aligned in the vertical and the horizontal directions, a contact formation spacing in at least one of the vertical and the horizontal directions in each of the first and the second contact array units is larger than a contact formation spacing determined by a manufacturing process, and the first and the second contact array units are placed one on another so as to be shifted from each other so that contact formation positions of the first contact array unit are situated midway between contact formation positions of the second contact array unit both in the vertical and the horizontal directions.

18. A method of manufacturing a semiconductor integrated circuit having a contact array in which a plurality of contacts is formed so as to be aligned in a vertical direction and a horizontal direction, wherein an entire area of a chip is sampled while sampling area, which is determined by a manufacturing process, is successively shifted, a number or an area of the contacts formed so as to be aligned in the vertical and the horizontal directions which contacts are present in the regions of the unit area is obtained, and a contact formation spacing is increased so that the number or the area of the contacts included in the regions of the unit area is not more than a predetermined value.

19. A method of manufacturing a semiconductor integrated circuit according to claim 15, wherein a rate of reduction, relative to the manufacturing process, of the contacts when the contact formation spacing is increased is varied according to a size of the contact array.

20. A method of manufacturing a semiconductor integrated circuit according to claim 16, wherein a rate of reduction of the contacts when the contact formation spacing is increased is varied according to a size of the contact array.

21. A method of manufacturing a semiconductor integrated circuit according to claim 17, wherein a rate of reduction of the contacts when the contact formation spacing is increased is varied according to a size of the contact array.

22. A method of manufacturing a semiconductor integrated circuit according to claim 18, wherein a rate of reduction of the contacts when the contact formation spacing is increased is varied according to a size of the contact array.

23. A method of manufacturing a semiconductor integrated circuit having a contact array in which a plurality of contacts is formed so as to be aligned in a vertical direction and a horizontal direction, wherein the contact array is divided into at least two contact array regions, and in at least one of the contact array regions, the contacts are formed at spacings not less than contact formation spacings determined by a manufacturing process and in a remaining contact array region, the contacts are formed at contact formation spacings larger than the contact formation spacing in the at least one of the contact array regions s.

24. A method of manufacturing a semiconductor integrated circuit having a contact array in which a plurality of contacts is formed so as to be aligned in a vertical direction and a horizontal direction, wherein the contact array is divided into at least three contact array regions, a number or an area of the contacts present in a region of a unit area is obtained, and the contacts are formed at spacings not less than contact formation spacings determined by a manufacturing process in each of at least two of the contact array regions arranged at predetermined region spacings so that the number or the area of contacts included in the region of the unit area is not more than a predetermined value.

25. A method of manufacturing a semiconductor integrated circuit according to claim 15, wherein at least three layers of contact arrays are longitudinally laminated, and in a contact array of an intermediate layer, as a result of increasing a contact formation spacing, contacts remaining in the contact array of the intermediate layer are re-arranged at spacings not less than contact spacings determined by a process, whereby a region of the contact array of the intermediate layer is smaller than regions of contact arrays of an uppermost layer and a lowermost layer.

26. A method of manufacturing a semiconductor integrated circuit according to claim 16, wherein at least three layers of contact arrays are longitudinally laminated, and in a contact array of an intermediate layer, as a result of increasing a contact formation spacing, contacts remaining in the contact array of the intermediate layer are re-arranged at spacings not less than contact spacings determined by a process, whereby a region of the contact array of the intermediate layer is smaller than regions of contact arrays of an uppermost layer and a lowermost layer.

27. A method of manufacturing a semiconductor integrated circuit according to claim 17, wherein at least three layers of contact arrays are longitudinally laminated, and in a contact array of an intermediate layer, as a result of increasing a contact formation spacing, contacts remaining in the contact array of the intermediate layer are re-arranged at spacings not less than contact spacings determined by a process, whereby a region of the contact array of the intermediate layer is smaller than regions of contact arrays of an uppermost layer and a lowermost layer.

28. A method of manufacturing a semiconductor integrated circuit according to claim 18, wherein at least three layers of contact arrays are longitudinally laminated, and in a contact array of an intermediate layer, as a result of increasing a contact formation spacing, contacts remaining in the contact array of the intermediate layer are re-arranged at spacings not less than contact spacings determined by a process, whereby a region of the contact array of the intermediate layer is smaller than regions of contact arrays of an uppermost layer and a lowermost layer.

29. A semiconductor integrated circuit having a contact array in which a plurality of contacts is formed so as to be aligned in a vertical direction and a horizontal direction, wherein the contact array comprises contacts in odd-numbered rows and contacts in even-numbered rows disposed in positions shifted by substantially half a pitch from the contacts in the odd-numbered rows in a direction of the rows, and at least one of a contact spacing of the contacts in the odd-numbered rows and a contact spacing of the contacts in the even-numbered rows, and a spacing between the rows of the contacts in the odd-numbered rows and a spacing between the rows of the contacts in the even-numbered rows are larger than a contact formation spacing determined by a manufacturing process.

30. A semiconductor integrated circuit according to claim 29, wherein a rate of reduction of the number of contacts when the contact formation spacing is increased is varied according to a size of the contact array.

* * * * *